:

US010468439B2

(12) United States Patent
Ikeda et al.

(10) Patent No.: US 10,468,439 B2
(45) Date of Patent: Nov. 5, 2019

(54) PHOTOELECTRIC CONVERSION DEVICE, RANGING APPARATUS, AND INFORMATION PROCESSING SYSTEM

(71) Applicant: CANON KABUSHIKI KAISHA, Tokyo (JP)

(72) Inventors: Hajime Ikeda, Yokohama (JP); Tatsuhito Goden, Machida (JP); Yoichi Wada, Yokohama (JP); Keisuke Ota, Tokyo (JP); Toshinori Hasegawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 462 days.

(21) Appl. No.: 15/225,479

(22) Filed: Aug. 1, 2016

(65) Prior Publication Data
US 2017/0040361 A1  Feb. 9, 2017

(30) Foreign Application Priority Data

Aug. 7, 2015 (JP) .................................. 2015-157636
Aug. 7, 2015 (JP) .................................. 2015-157637
(Continued)

(51) Int. Cl.
*H01L 27/146* (2006.01)
*G01S 7/487* (2006.01)
(Continued)

(52) U.S. Cl.
CPC ...... *H01L 27/14605* (2013.01); *G01S 7/4876* (2013.01); *G01S 17/10* (2013.01);
(Continued)

(58) Field of Classification Search
CPC .............. G01S 7/4876; G01S 7/4914; H01L 27/14605; H01L 27/14603; H01L 27/14609
See application file for complete search history.

(56) References Cited

U.S. PATENT DOCUMENTS 9,344,657 B2 * 5/2016 Kim ...................... G01C 15/06
2006/0231870 A1 10/2006 Park
2007/0103748 A1 5/2007 Hashimoto

FOREIGN PATENT DOCUMENTS

CN        1659447 A      8/2005
JP      S59-018912 A     1/1984
(Continued)

*Primary Examiner* — Matthew L Reames
(74) *Attorney, Agent, or Firm* — Canon U.S.A., Inc. IP Division

(57) ABSTRACT

A photoelectric conversion device includes a first photoelectric conversion portion configured to generate electrons; a second photoelectric conversion portion configured to generate holes; a charge-to-voltage conversion portion including an n-type first semiconductor region configured to collect the generated electrons and a p-type second semiconductor region configured to collect the generated holes, the charge-to-voltage conversion portion being configured to convert a charge that is based on the electrons and the holes to a voltage; and a signal generation portion configured to generate a signal corresponding to the voltage, the signal generation portion including an amplification transistor.

24 Claims, 8 Drawing Sheets

(30) Foreign Application Priority Data

Aug. 7, 2015 (JP) ................................ 2015-157638
Aug. 7, 2015 (JP) ................................ 2015-157639
Aug. 7, 2015 (JP) ................................ 2015-157640

(51) Int. Cl.
*G01S 17/10* (2006.01)
*H01L 31/16* (2006.01)

(52) U.S. Cl.
CPC .. *H01L 27/14636* (2013.01); *H01L 27/14641* (2013.01); *H01L 31/162* (2013.01)

(56) References Cited

FOREIGN PATENT DOCUMENTS

| | | |
|---|---|---|
| JP | H08-335712 A | 12/1996 |
| JP | 2000-244007 A | 9/2000 |
| JP | 2005-70014 A | 3/2005 |
| JP | 2005-303268 A | 10/2005 |
| JP | 2006-190791 A | 7/2006 |
| JP | 2007-88309 A | 4/2007 |
| JP | 2007-201092 A | 8/2007 |
| JP | 2008-89346 A | 4/2008 |
| JP | 2010-267720 A | 11/2010 |
| JP | 2013-137242 A | 7/2013 |
| JP | 2013-153050 A | 8/2013 |
| JP | 2014-207390 A | 10/2014 |
| JP | 2016-213356 A | 12/2016 |
| RU | 2155322 C1 | 8/2000 |
| TW | 510059 B | 11/2002 |
| TW | 201444321 A | 11/2014 |
| TW | 201529800 A | 8/2015 |

* cited by examiner

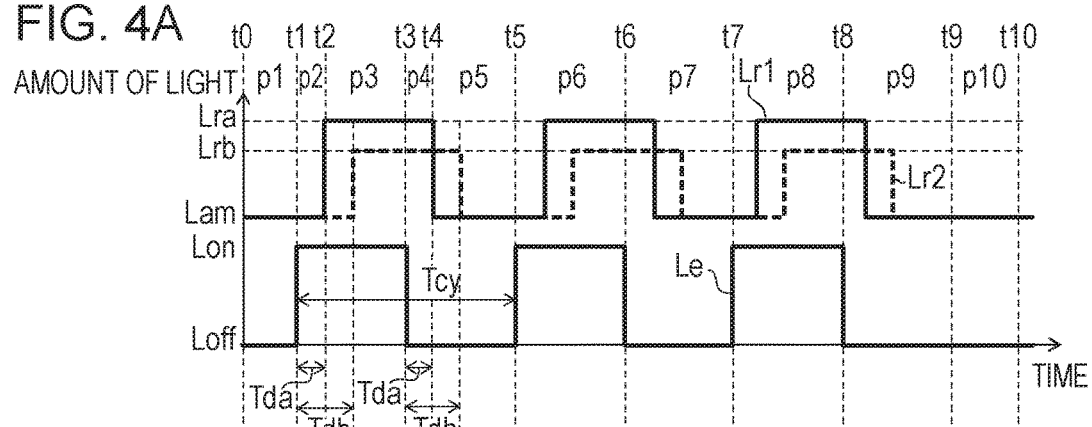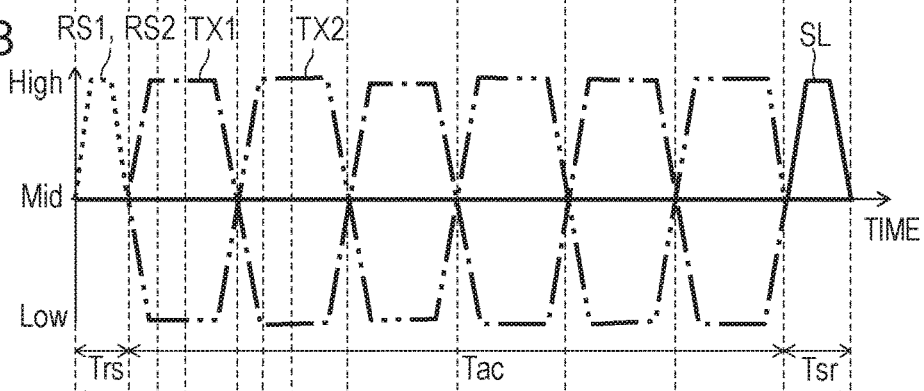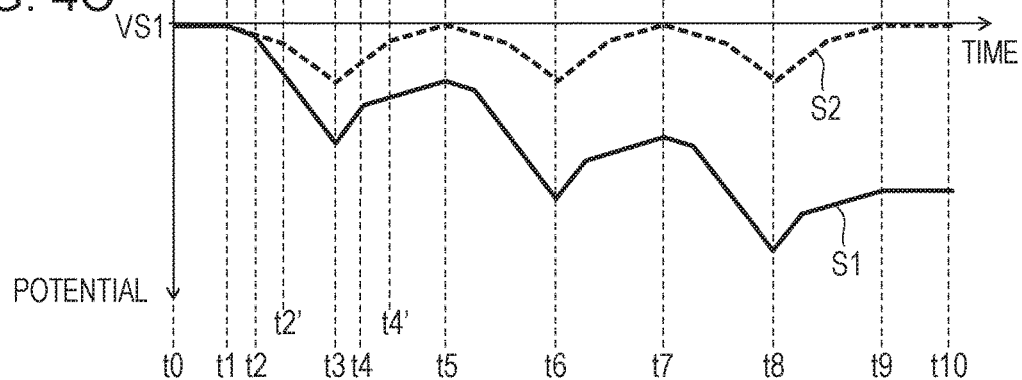

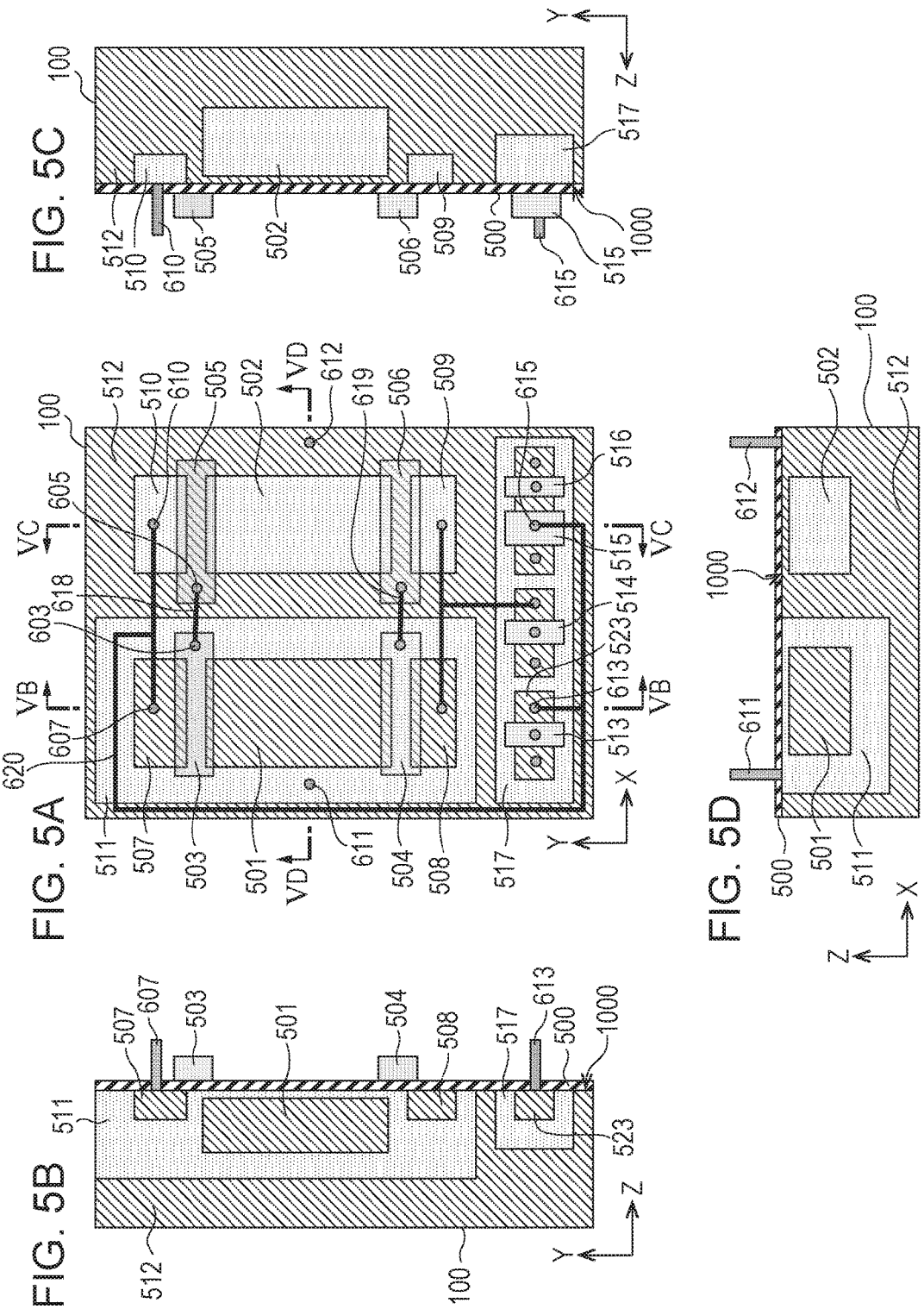

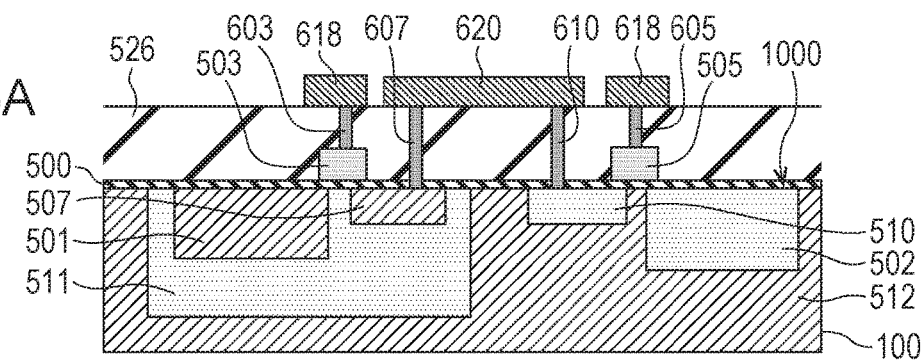
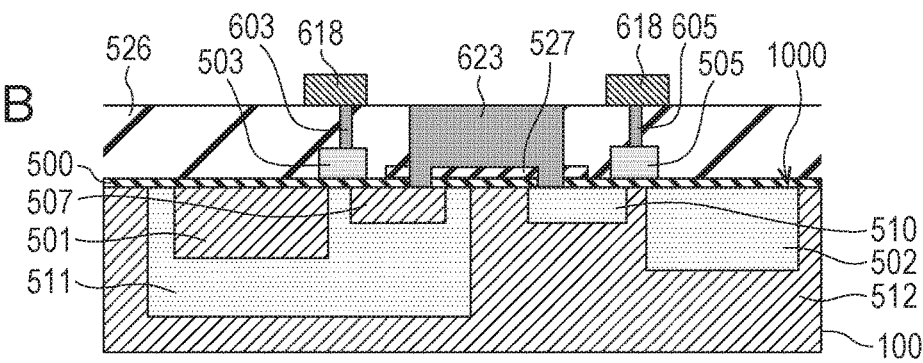
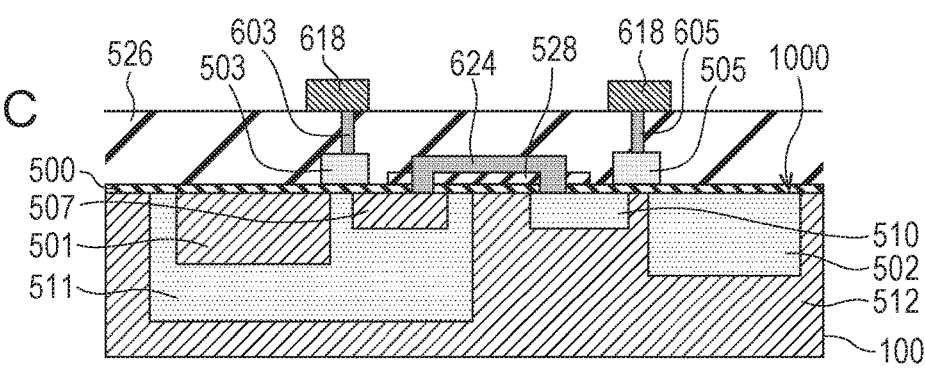
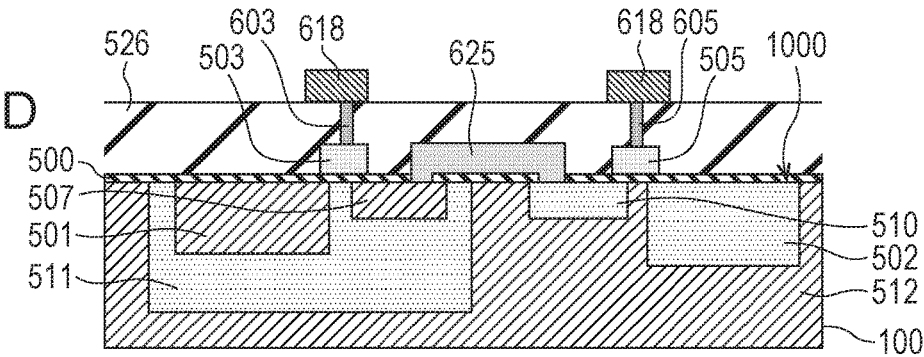

PHOTOELECTRIC CONVERSION DEVICE, RANGING APPARATUS, AND INFORMATION PROCESSING SYSTEM

BACKGROUND OF THE INVENTION

Field of the Invention

The present technique relates to a photoelectric conversion device.

Description of the Related Art

There is a ranging apparatus (distance sensor) using a time of flight (TOF) method. In the TOF method, a target of distance measurement is irradiated with light emitted by a light source, and the light reflected by the target is received. On the basis of the relationship between the speed of light and the time period from the irradiation to the light reception, the distance to the target is calculated. Here, the light that has been emitted by the light source for ranging and reflected by the target is referred to as signal light. The received light includes, in addition to the signal light, light (ambient light) derived from a light source different from the light source for ranging, such as natural light or artificial light. To enhance the ranging accuracy, it is effective to separate the ambient light and the signal light from each other.

Japanese Patent Laid-Open No. 2005-303268 (US Patent Application No. 2007/0103748) discloses a technique of removing a component corresponding to ambient light by an apparatus that performs ranging by using a light detecting element. According to the second embodiment of this publication, the light detecting element includes a first photosensitive unit which has a suitable structure for picking out holes and a second photosensitive unit which has a suitable structure for picking out electrons. The holes generated at the first photosensitive unit are held by a hole holding unit through a gate unit, and the electrons generated at the second photosensitive unit are held by an electron holding unit through the gate unit. The holes held by the hole holding unit and the electrons held by the electron holding unit are recombined by a recombination unit, and the carriers remained after the recombination are picked out as object carriers through an output unit.

Japanese Patent Laid-Open No. 2008-89346 (US Patent Application No. 2008/0079833) discloses a technique of removing noise derived from background light (ambient light) by selectively conducting a plurality of charge-storage sections and a plurality of capacitors to extract a difference component of charge stored in the plurality of charge-storage sections.

SUMMARY OF THE INVENTION

A photoelectric conversion device according to the present disclosure includes a first photoelectric conversion portion configured to generate electrons; a second photoelectric conversion portion configured to generate holes; a charge-to-voltage conversion portion including an n-type first semiconductor region configured to collect the electrons and a p-type second semiconductor region configured to collect the holes, the charge-to-voltage conversion portion being configured to convert a charge that is based on the electrons and the holes to a voltage; and a signal generation portion configured to generate a signal corresponding to the voltage, the signal generation portion including an amplification transistor.

Further features of the present invention will become apparent from the following description of exemplary embodiments with reference to the attached drawings.

BRIEF DESCRIPTION OF THE DRAWINGS

FIGS. 4A to 4C are schematic diagrams for describing an operation of the photoelectric conversion device.

FIGS. 5A to 5D are schematic diagrams for describing a structure of the photoelectric conversion device.

FIGS. 6A to 6D are schematic diagrams for describing structures of the photoelectric conversion device.

DESCRIPTION OF THE EMBODIMENTS

Figure 1A:
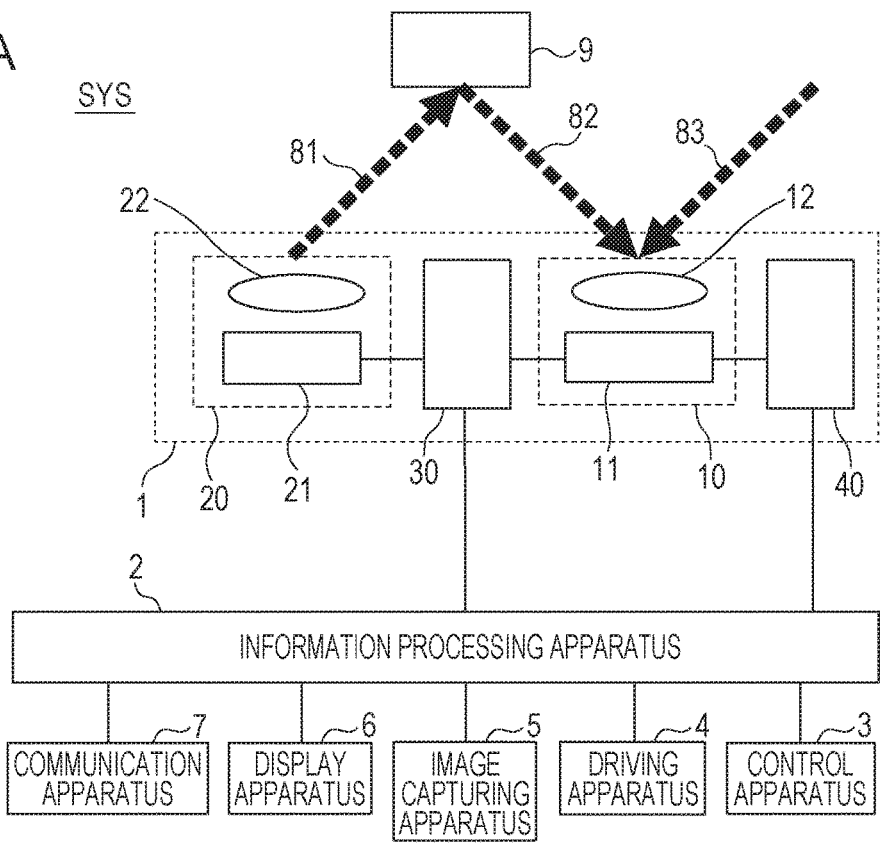
FIGS. 1A and 1B are schematic diagrams for describing a photoelectric conversion device, a ranging apparatus, and an information processing system.

An embodiment provides a photoelectric conversion device capable of enhancing the accuracy of signals.

In the technique according to Japanese Patent Laid-Open No. 2005-303268 (US Patent Application No. 2007/0103748), sufficient consideration is not given to movements of electrons and holes in the case of using a photoelectric conversion unit (photosensitive unit) for holes and a photoelectric conversion unit (photosensitive unit) for electrons. Thus, there is a possibility that electrons and holes will not efficiently be collected and that the accuracy of signals generated based on the electrons and holes will decrease. Accordingly, the embodiment provides a photoelectric conversion device capable of enhancing the accuracy of signals generated based on the electrons and holes.

A photoelectric conversion device according to a first aspect of the embodiment includes a first photodiode that generates electrons, a second photodiode that generates holes, an n-type first semiconductor region that collects the electrons generated by the first photodiode, a p-type second semiconductor region that collects the holes generated by the second photodiode, a signal generation portion to which the first semiconductor region and the second semiconductor region are connected in common, a first potential supply portion that supplies a first potential to an anode of the first photodiode, and a second potential supply portion that supplies a second potential to a cathode of the second photodiode. The second potential is higher than the first potential.

According to the first aspect, there is provided a photoelectric conversion device capable of enhancing the accuracy of signals generated based on electrons and holes.

In the technique according to Japanese Patent Laid-Open No. 2008-89346 (US Patent Application No. 2008/0079833), switching noise (kCT noise) generated at the time of selectively switching the conduction of the plurality of charge-storage sections and the plurality of capacitors degrades the signal-to-noise ratio, as described in paragraphs 0109 and 0110. Thus, in this technique, it is difficult to accurately extract a difference component of charge stored in the plurality of charge-storage sections. Accordingly, the embodiment provides a photoelectric conversion device that accurately generates a signal corresponding to a difference in charge between a plurality of photoelectric conversion portions.

A photoelectric conversion device according to a second aspect of the embodiment includes a first photoelectric conversion portion that generates electrons, a second photoelectric conversion portion that generates holes, an n-type first semiconductor region that collects the electrons generated by the first photoelectric conversion portion, a p-type second semiconductor region that collects the holes generated by the second photoelectric conversion portion, and a signal generation portion to which the first semiconductor region and the second semiconductor region are connected in common. A difference between a first potential supplied to the first semiconductor region and a second potential supplied to the second semiconductor region in a reset period is less than 0.10 V.

According to the second aspect, there is provided a photoelectric conversion device that accurately generates a signal corresponding to a difference in charge between a plurality of photoelectric conversion portions.

In the technique according to Japanese Patent Laid-Open No. 2005-303268 (US Patent Application No. 2007/0103748), sufficient consideration is not given to the configuration of the recombination unit in a case where the hole holding unit and the electron holding unit are separately provided. Accordingly, the embodiment provides a photoelectric conversion device capable of obtaining, with a simple configuration, a signal corresponding to a difference in the amount of signal charge generated by a plurality of photoelectric conversion portions.

A photoelectric conversion device according to a third aspect of the embodiment includes a first photoelectric conversion portion that generates electrons, a second photoelectric conversion portion that generates holes, an n-type first semiconductor region that collects the electrons generated by the first photoelectric conversion portion, a p-type second semiconductor region that collects the holes generated by the second photoelectric conversion portion, and a signal generation portion to which the first semiconductor region and the second semiconductor region are connected in common. The first semiconductor region and the second semiconductor region are connected to each other via a conductor.

According to the third aspect, there is provided a photoelectric conversion device capable of obtaining, with a simple configuration, a signal corresponding to a difference in the amount of signal charge generated by a plurality of photoelectric conversion portions.

In the technique according to Japanese Patent Laid-Open No. 2005-303268 (US Patent Application No. 2007/0103748), a timing control unit controls an applied voltage and thereby individual gate units can be opened alternatively. However, it is difficult to accurately control the applied voltage at high speed. In particular, if the time lag of ON/OFF switching between two gate units is large, the accuracy of signals generated based on electrons and holes may be decreased. Accordingly, the embodiment provides a photoelectric conversion device capable of enhancing the accuracy of signals generated based on electrons and holes.

A photoelectric conversion device according to a fourth aspect of the embodiment includes a first photoelectric conversion portion that generates electrons, a second photoelectric conversion portion that generates holes, a first transfer portion that transfers the electrons generated by the first photoelectric conversion portion to an n-type first semiconductor region, and a second transfer portion that transfers the holes generated by the second photoelectric conversion portion to a p-type second semiconductor region. The first transfer portion and the second transfer portion are connected to the same node, the first transfer portion is brought into an ON state and the second transfer portion is brought into an OFF state in response to supply of a first potential to the node, and the first transfer portion is brought into an OFF state and the second transfer portion is brought into an ON state in response to supply of a second potential to the node.

According to the fourth aspect, there is provided a photoelectric conversion device capable of enhancing the accuracy of signals generated based on electrons and holes.

In the technique according to Japanese Patent Laid-Open No. 2005-303268 (US Patent Application No. 2007/0103748), sufficient consideration is not given to how the photoelectric conversion unit (photosensitive unit) for holes and the photoelectric conversion unit (photosensitive unit) for electrons are arranged. Accordingly, the embodiment provides a photoelectric conversion device that generates, with a simple configuration, signals based on electrons and holes.

A photoelectric conversion device according to a fifth aspect of the embodiment includes a first photodiode that generates electrons, a second photodiode that generates holes, an n-type first semiconductor region that collects the electrons generated by the first photodiode, a p-type second semiconductor region that collects the holes generated by the second photodiode, and a signal generation portion to which the first semiconductor region and the second semiconductor region are connected in common. A p-type third semiconductor region that constitutes an anode of the first photodiode and an n-type fourth semiconductor region that constitutes a cathode of the second photodiode are electrically isolated from each other by a p-n junction.

According to the fifth aspect, there is provided a photoelectric conversion device that generates, with a simple configuration, signals based on electrons and holes.

Hereinafter, the embodiment will be described in detail with reference to the attached drawings. In the following description and the attached drawings, the same elements are denoted by the same reference numerals throughout a plurality of figures. Thus, the same elements will be described with reference to the plurality of figures, and the description of the elements denoted by the same reference numerals is appropriately omitted.

With reference to FIG. 1A, a description will be given of a photoelectric conversion device 11 and an information processing system SYS including the photoelectric conversion device 11. The information processing system SYS includes a ranging apparatus 1 and may further include at least any one of an information processing apparatus 2, a control apparatus 3, a driving apparatus 4, an image capturing apparatus 5, a display apparatus 6, and a communication apparatus 7. In the information processing system SYS, the photoelectric conversion device 11 is included in the ranging apparatus 1. The image capturing apparatus 5 may include a photoelectric conversion device different from the photoelectric conversion device 11 of the ranging apparatus 1. Alternatively, the photoelectric conversion device 11 may function as a photoelectric conversion device of the ranging apparatus 1 and a photoelectric conversion device of the image capturing apparatus 5. Application examples of the information processing system SYS will be described below.

The ranging apparatus 1 includes a light receiving unit 10. The ranging apparatus 1 may include a light emitting unit 20. The light receiving unit 10 includes the photoelectric conversion device 11 and an optical system 12 that controls incident light on the photoelectric conversion device 11. The light emitting unit 20 includes a light emitting device 21 serving as a light source and an optical system 22 that controls outgoing light from the light emitting device 21. As the light emitting device 21, a light emitting diode may be used because it is capable of repeatedly blinking at high speed. The wavelength of light emitted by the light emitting device 21 may be infrared for the purpose of reducing color mixture with ambient light mainly including visible light. Infrared is hard to be visually identified by a human and thus can be comfortably used. However, the embodiment is not limited to infrared light. The optical systems 12 and 22 each include a lens, a diaphragm, a mechanical shutter, a scattering plate, an optical low-pass filter, a wavelength selection filter, and so forth. For example, the optical system 12 may include a filter having a higher transmittance for infrared light than that for visible light. The ranging apparatus 1 illustrated in FIG. 1A includes the optical systems 12 and 22, but at least any one of these optical systems may be omitted. In the case of using laser light as a light source, the optical system 22 may include a scanning optical system for scanning the light emitted by the light emitting unit 20 toward a predetermined region. The ranging apparatus 1 may include a control unit 30 that is connected to at least one of the light receiving unit 10 and the light emitting unit 20. The control unit 30 drives and/or controls at least one of the light receiving unit 10 and the light emitting unit 20. The control unit 30 according to the embodiment that is connected to both the light receiving unit 10 and the light emitting unit 20 is capable of driving and/or controlling both the light receiving unit 10 and the light emitting unit 20, and specifically is capable of driving and/or controlling both of them in synchronization. The control unit 30 is also capable of operating in response to a signal received from the information processing apparatus 2. The ranging apparatus 1 may include a processing unit 40 that is connected to the light receiving unit 10. The processing unit 40 processes signals output from the light receiving unit 10. The signals processed by the processing unit 40 may be transmitted to the information processing apparatus 2. At least one of the control unit 30 and the processing unit 40 is capable of operating in response to a signal received from the information processing apparatus 2.

Light 81 emitted by the light emitting unit 20 is applied to a target 9, is reflected by the target 9, and is received as signal light 82 by the light receiving unit 10. A difference based on the distance from the ranging apparatus 1 to the target 9 and the speed of light ($3 \times 10^8$ m/s) is generated between a light emission time at the light emitting unit 20 and a light reception time at the light receiving unit 10. With the physical amount corresponding to the time difference being detected, the distance from the ranging apparatus 1 to the target 9 or information based on the distance from the ranging apparatus 1 to the target 9 can be obtained as, for example, image data. The ranging apparatus 1 is a ranging apparatus using a time of flight (TOF) method. The degree of the above-described time difference can be detected by measuring a phase difference of light that periodically changes or the number of light pulses. A large interval between the light emitting unit 20 and the light receiving unit 10 could make a ranging algorithm complicated, and thus the interval between the light emitting unit 20 and the light receiving unit 10 may be set to be shorter than the interval corresponding to desired ranging accuracy. For example, the interval between the light emitting unit 20 and the light receiving unit 10 is set to 1 m or less.

Not only the signal light 82 but also ambient light 83 derived from a light source other than the light emitted by the light emitting device 21 as a light source enter the light receiving unit 10. The light source of the ambient light 83 is natural light or artificial light. The ambient light 83 is a noise component when ranging is performed. Thus, if the ratio of the ambient light 83 to received light is high, the dynamic range of a signal based on the signal light 82 decreases or the S/N ratio decreases, and it is difficult to accurately obtain distance information from the signal light 82. The photoelectric conversion device 11 according to the embodiment is capable of removing at least part of a component resulted from the ambient light 83 from a signal generated based on the light received by the photoelectric conversion device 11. Accordingly, the ranging accuracy can be enhanced. Although the details will be described below, in the embodiment, at least part of a component resulted from the ambient light 83 is removed by using a signal corresponding to a difference in the amount of signal charge generated by a plurality of photoelectric conversion portions. Furthermore, with use of electrons and holes as signal charge, the difference in the amount of charge can be accurately detected by using a simple structure. Accordingly, the ranging accuracy can be enhanced.

Figure 1B:
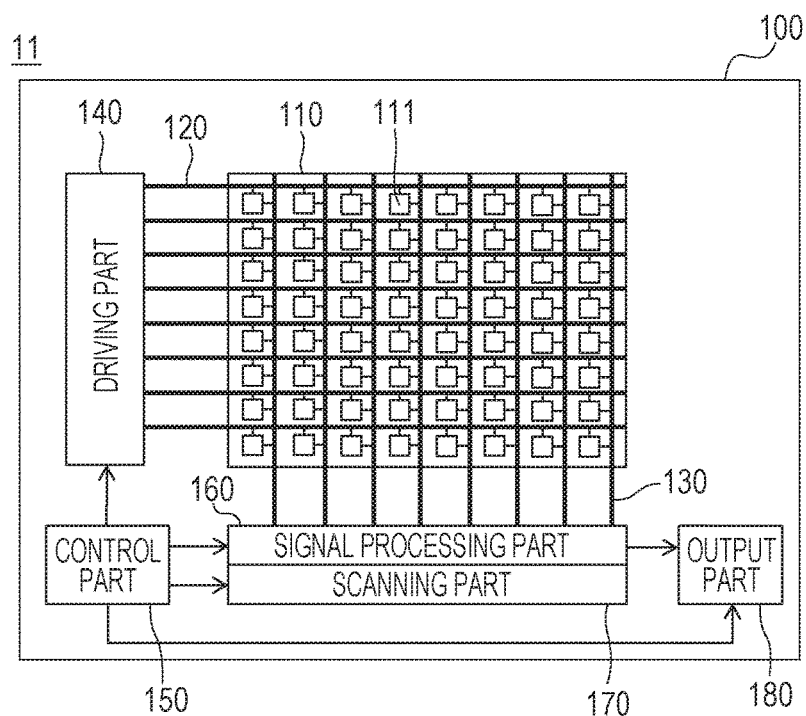

An overview of the photoelectric conversion device 11 according to the embodiment will be described with reference to FIG. 1B. The photoelectric conversion device 11 includes a cell array 110 on a semiconductor substrate 100. The cell array 110 includes a plurality of photoelectric conversion cells 111, which are arranged in a matrix formed of a plurality of rows and a plurality of columns. The photoelectric conversion device 11 may also include, on the semiconductor substrate 100, row wiring lines 120, column wiring lines 130, a driving part 140, a control part 150, a signal processing part 160, a scanning part 170, and an output part 180. The plurality of photoelectric conversion cells 111 in the cell array 110 are connected to the driving part 140 through the row wiring lines 120 located on the semiconductor substrate 100 in units of rows. The driving part 140 selectively inputs drive signals, such as transfer signals or reset signals, to the plurality of photoelectric conversion cells 111 sequentially or simultaneously. The plurality of photoelectric conversion cells 111 in the cell array 110 are connected to the signal processing part 160 through the column wiring lines 130 located on the semiconductor substrate 100 in units of columns. The signal processing part 160 processes the signals output from the photoelectric conversion cells 111 through the column wiring lines 130. The signal processing part 160 may include, for each column of the cell array 110, a CDS circuit, an amplification circuit, and an AD conversion circuit. The scanning part 170 causes the signals that have been output from the cell array 110 to the signal processing part 160 through the individual column wiring lines 130 and processed by the signal processing part 160 and that correspond to the individual columns to be sequentially output from the signal processing part 160 to the output part 180. The output part 180 outputs the signals received from the signal processing part 160 to the outside of the photoelectric conversion device 11 and may include an amplification circuit, a protection circuit, and an electrode for establishing a connection with an external circuit. The control part 150 generates control signals and controls the operation timings of the driving part 140, the signal processing part 160, the scanning part 170, and the output part 180 by using the control signals.

An on-chip lens array (microlens array) and a wavelength filter may be provided on an incidence surface side of the semiconductor substrate 100. The incidence surface side may be identical to the side on which the row wiring lines 120 and the column wiring lines 130 are provided on the semiconductor substrate 100 (front surface side). With this arrangement, a front-surface-irradiation photoelectric conversion device can be obtained. If the incidence surface side is opposite to the side on which the row wiring lines 120 and the column wiring lines 130 are provided on the semiconductor substrate 100 (rear surface side), a rear-surface-irradiation photoelectric conversion device can be obtained.

Figure 2:
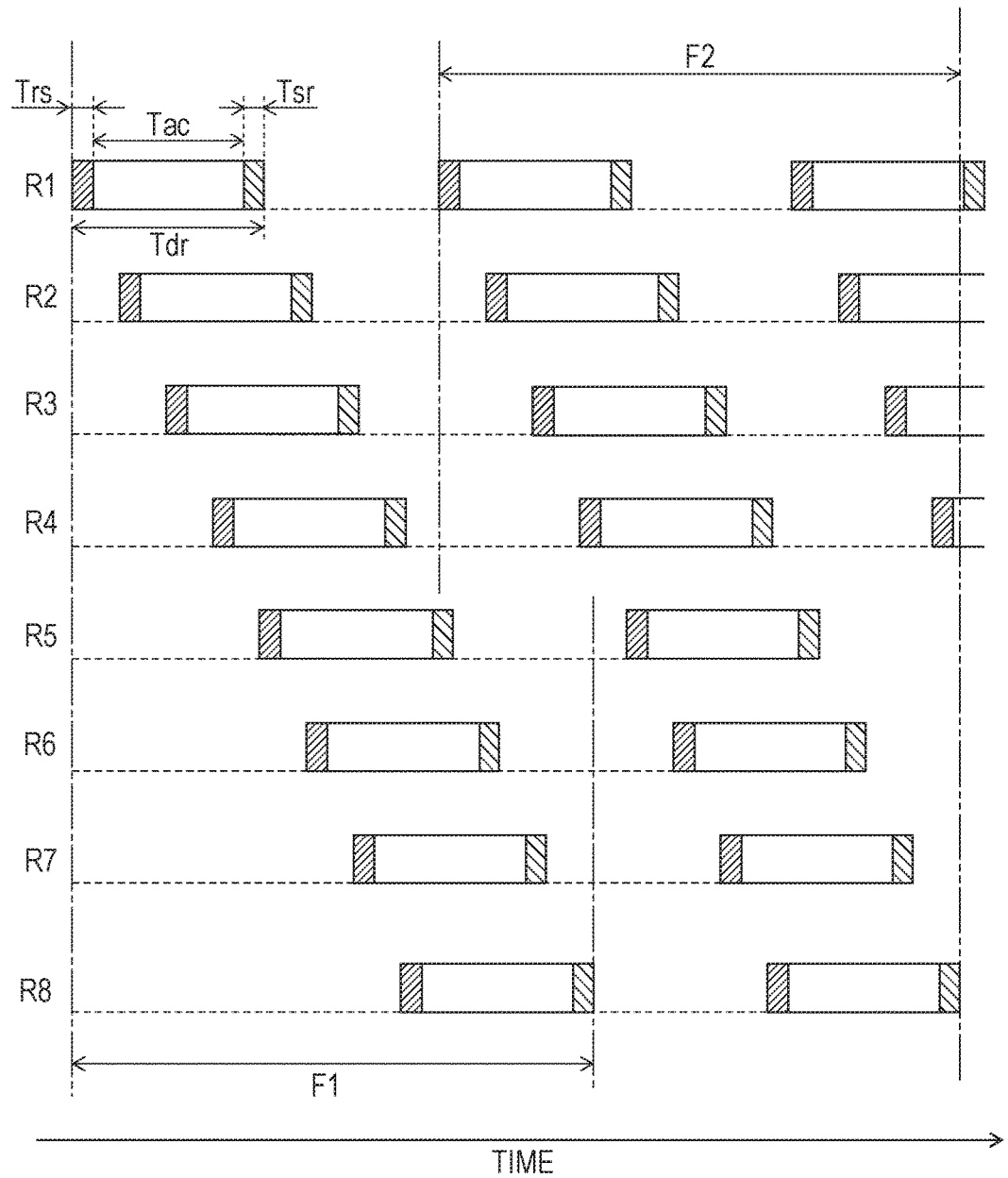
FIG. 2 is a schematic diagram for describing an operation of the photoelectric conversion device.

FIG. 2 illustrates an operation in eight rows in a case where the cell array 110 includes eight rows of the photoelectric conversion cells 111. In the example illustrated in FIG. 2, progressive scanning is performed on a first row R1 to an eighth row R8. Alternatively, interlace scanning may be performed.

A drive period Tdr for one photoelectric conversion cell 111 includes a reset period Trs in which a reset operation is performed, an accumulation period Tac in which an accumulation operation for accumulating charge based on the signal light 82 is performed, and a read period Tsr in which a read operation for reading signals based on accumulated charge is performed. The read period Tsr may also be referred to as a period in which output from the photoelectric conversion cell to the column wiring line is performed. The drive period Tdr may further include a period in which another desired operation is performed. In this example, the plurality of photoelectric conversion cells 111 belonging to the same row are simultaneously driven within a single drive period Tdr. The signals output from the plurality of photoelectric conversion cells 111 belonging to the same row of the cell array 110 are processed by the signal processing part 160 and are output to the output part 180, as described above with reference to FIG. 1B.

A frame period is a period in which reset operations, accumulation operations, and read operations are performed in all the rows of the photoelectric conversion cells 111 constituting the cell array 110. For example, the starting point of a first frame period F1 is the time point at which the reset operation in the first row R1 is started, and the end point of the first frame period F1 is the time point at which the read operation in the photoelectric conversion cells 111 in the eighth row R8 is ended. The starting point of a second frame period F2 is the time point at which the reset operation in the first row R1 is started for the first time after the read operation in the first row R1 is ended in the first frame period F1. The end point of the second frame period F2 is the time point at which the read operation in the eighth row R8 is ended for the first time after the read operation in the eighth row R8 is ended in the first frame period F1.

As illustrated in FIG. 2, the accumulation operations in a plurality of rows (in this example, three to four rows) are performed in parallel, and thus the accumulation period can be extended and the output of signals obtained in the accumulation period can be increased. Even when the accumulation operations in a plurality of rows are performed in parallel, signals in the plurality of rows can be separated from one another by making the read operation timing different among the rows.

Furthermore, as a result of performing a series of operations so that part of the first frame period F1 overlaps part of the second frame period F2 as illustrated in FIG. 2, the frame rate can be increased or one frame period can be extended. That is, in FIG. 2, at the time when the read operations in the first to fourth rows are ended in the first frame period F1, the reset operation and the accumulation operation in the first row are started.

The embodiment is not limited to this example. After all the reset operation, accumulation operation, and read operation in one row have been ended, the reset operation, accumulation operation, and read operation in the next row may be started. Alternatively, after the read operation in the last row (eighth row) has been ended, the reset operation in the first row may be started.

Figure 3:
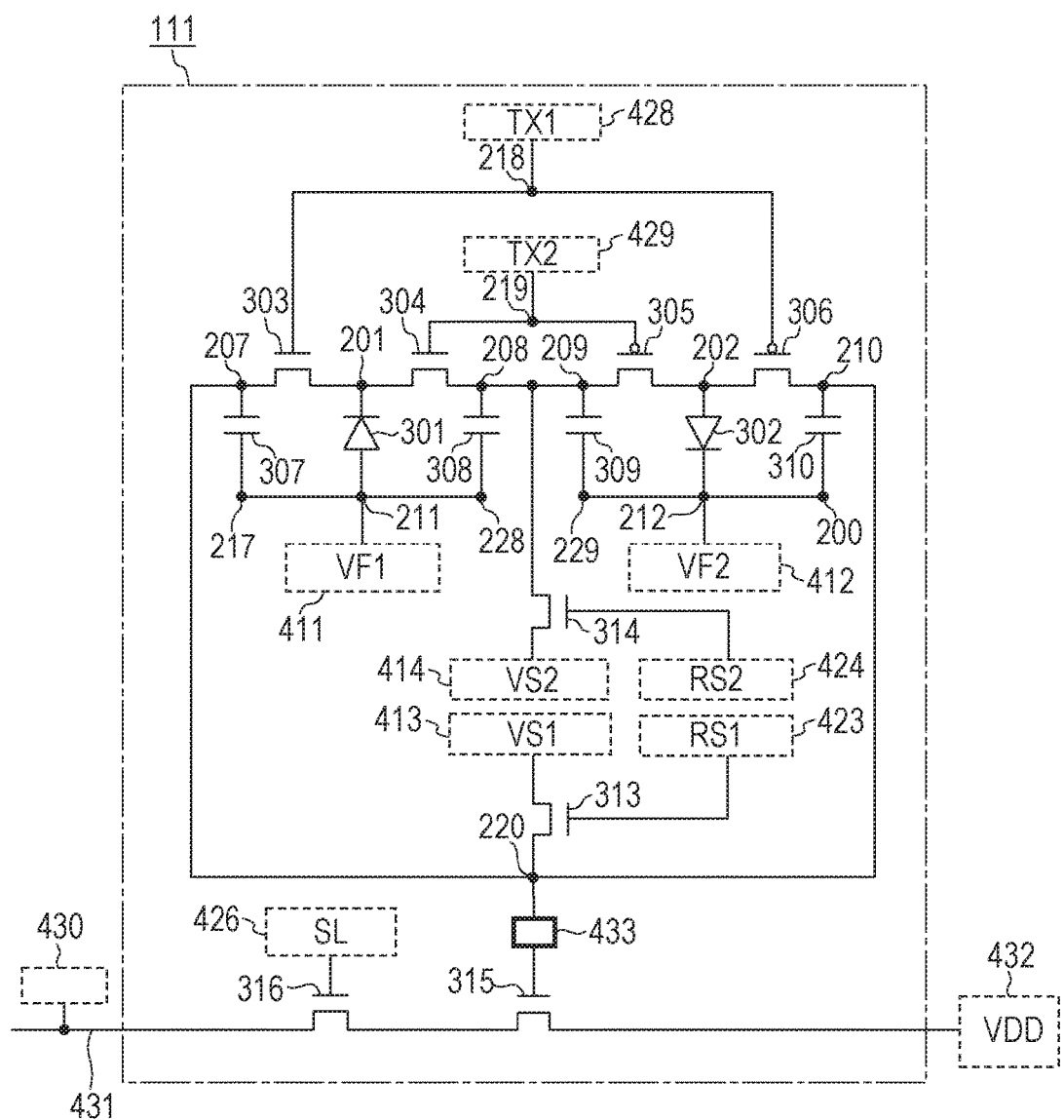
FIG. 3 is a schematic diagram for describing a circuit of the photoelectric conversion device.

Next, a description will be given of an example structure of each photoelectric conversion cell 111. FIG. 3 illustrates an equivalent circuit of the photoelectric conversion cell 111. In FIG. 3, the elements included in the photoelectric conversion cell 111 as a repetition unit of the matrix are surrounded by a chained line. Note that, regarding the elements surrounded by a broken line, part of the elements may be located outside the cell array 110 (for example, the driving part 140).

The photoelectric conversion cell 111 includes a photoelectric conversion portion 301 and a photoelectric conversion portion 302. The photoelectric conversion portion 301 generates electrons as signal charge through photoelectric conversion, whereas the photoelectric conversion portion 302 generates holes as signal charge through photoelectric conversion. That is, the positive/negative sign of the signal charge generated by the photoelectric conversion portion 301 is opposite to that of the signal charge generated by the photoelectric conversion portion 302. However, the photoelectric conversion portion 301 generates holes as well as electrons and the photoelectric conversion portion 302 generates electrons as well as holes. Each of the photoelectric conversion portions 301 and 302 is a PN photodiode or PIN photodiode, and may be a buried photodiode in view of reducing dark current. Using buried photodiodes as the photoelectric conversion portions 301 and 302 is beneficial in terms of reducing dark current compared to the case of using photogates as the photoelectric conversion portions 301 and 302 and increasing the S/N ratio that is important to receive weak signal light. The photodiode serving as the photoelectric conversion portion 301 includes a cathode 201, which is an n-type semiconductor region where electrons are majority carriers, and an anode 211, which is a p-type semiconductor region where electrons are minority carriers. The photodiode serving as the photoelectric conversion portion 302 includes an anode 202, which is a p-type semiconductor region where holes are majority carriers, and a cathode 212, which is an n-type semiconductor region where holes are minority carriers.

The photoelectric conversion cell 111 includes a capacitor portion 307 capable of holding electrons as signal charge generated by the photoelectric conversion portion 301, and a capacitor portion 310 capable of holding holes as signal charge generated by the photoelectric conversion portion 302.

The capacitor portion 307 includes a reference node 217 and a collection node 207. The collection node 207 collects electrons as signal charge generated by the photoelectric conversion portion 301. The capacitor portion 307 is configured so that a potential difference corresponding to the amount of charge held by the capacitor portion 307 appears between the collection node 207 and the reference node 217. That is, the capacitor portion 307 functions as a charge-to-voltage conversion portion that converts the amount of charge to a voltage. The capacitor portion 310 includes a reference node 200 and a collection node 210. The collection node 210 collects holes as signal charge generated by the photoelectric conversion portion 302. The capacitor portion 310 is configured so that a potential difference corresponding to the amount of charge held by the capacitor portion 310 appears between the collection node 210 and the reference node 200. That is, the capacitor portion 310 functions as a charge-to-voltage conversion portion that converts the amount of charge to a voltage.

The capacitor portions 307 and 310 each have a p-n junction diode structure. The reference node 217 and the collection node 210 are p-type semiconductor regions, whereas the reference node 200 and the collection node 207 are n-type semiconductor regions. The collection nodes 207 and 210 that hold signal charge are floating nodes that are electrically floating. The semiconductor regions constituting the collection nodes 207 and 210 are impurity diffusion regions in a floating state, that is, floating diffusion. The collection node 207, which is an n-type semiconductor region, may collect electrons as signal charge and hold the electrons. The collection node 210, which is a p-type semiconductor region, may collect holes as signal charge and hold the holes. Although the details will be described below, the photoelectric conversion device 11 is capable of operating so that signal charge is selectively held by one of the collection nodes 207 and 210.

The photoelectric conversion cell 111 includes a transfer portion 303 in order to efficiently collect electrons, among the electrons and holes generated by the photoelectric conversion portion 301, to the collection node 207 of the capacitor portion 307. Also, the photoelectric conversion cell 111 includes a transfer portion 306 in order to efficiently collect holes, among the electrons and holes generated by the photoelectric conversion portion 302, to the collection node 210 of the capacitor portion 310. Thus, the collection nodes 207 and 210 can also be referred to as nodes to which signal charge is transferred from the photoelectric conversion portions 301 and 302, respectively. Since the collection nodes 207 and 210 are capable of holding the charge transferred from the photoelectric conversion portions 301 and 302, the collection nodes (capacitor portions) can also be referred to as charge holding portions.

The transfer portions 303 and 306 each have an MIS gate structure. Specifically, the transfer portions 303 and 306 have a multilayer structure including a semiconductor region (channel region), a gate insulating film, and a gate electrode. Thus, the transfer portions 303 and 306 can also be referred to as transfer gates. When the transfer portion 303 is in an ON state (conducting state), inversion forms an n-type channel in the semiconductor region. When the transfer portion 306 is in an ON state, inversion forms a p-type channel in the semiconductor region. In this way, the conductivity types of the transfer portions 303 and 306 are different from each other.

In this example, the gate electrode of the transfer portion 303 and the gate electrode of the transfer potion 306 are connected in common to a transfer node 218. The transfer node 218 is connected to a transfer signal output portion 428, and a transfer signal TX1 is input from the transfer signal output portion 428 to the transfer node 218. The transfer portions 303 and 306 have different conductivity types and are configured to operate complementarily. That is, the transfer portion 306 is in an OFF state (non-conducting state) in a period when the transfer portion 303 is in an ON state in response to the transfer signal TX1, and the transfer portion 306 is in an ON state in a period when the transfer portion 303 is in an OFF state in response to the transfer signal TX1.

A threshold may be set so that both the transfer portions 303 and 306 are brought into an OFF state when the transfer node 218 is at a predetermined potential. The predetermined potential may be a potential between the potential at which the transfer portion 303 is in an ON state and the transfer portion 306 is in an OFF state and the potential at which the transfer portion 303 is in an OFF state and the transfer portion 306 is in an ON state. Such a predetermined potential is determined in accordance with the potential in the semiconductor region in the MIS gate structure and a threshold of the MIS gate structure. A difference between a potential level High at which the transfer portion 303 is in an ON state and a potential level Mid at which the transfer portion 303 is in an OFF state is, for example, 1 to 5 V. A difference between a potential level Low at which the transfer portion 306 is in an ON state and the potential level Mid at which the transfer portion 303 is in an OFF state is, for example, 1 to 5 V. The potential level High may be set to a potential (positive potential) higher than a ground potential GND (0 V), and the potential level Low may be set to a potential (negative potential) lower than the ground potential GND. For example, the potential level Mid may be set to the ground potential GND. Both the potential levels High and Low may be set to positive potentials or both the potential levels High and Low may be set to negative potentials, so as to reduce the circuit scale.

Alternatively, the transfer portions 303 and 306 may be connected to different transfer nodes and the ON/OFF states of the transfer portions 303 and 306 may be controlled by using transfer signals independent of each other. However, it may be better to connect the transfer portions 303 and 306 to the same transfer node 218 and input the same transfer signal TX1 to the gate electrodes of the transfer portions 303 and 306. Accordingly, the accuracy of timing control of ON/OFF states of the transfer portions 303 and 306 can be enhanced. Furthermore, since the transfer portions 303 and 306 can be driven by the same driving circuit and wiring line, the configuration of the photoelectric conversion device 11 can be simplified.

In the above-described manner, the collection node 207 is connected to the cathode 201 via the transfer portion 303. Also, the collection node 210 is connected to the anode 202 via the transfer portion 306.

The collection node 207 may be connected to the cathode 201 without via an active element such as the transfer portion 303. Also, the collection node 210 may be connected to the anode 202 without via an active element such as the transfer portion 306. For example, by maintaining an appropriate relationship between the potential at the photoelectric conversion portion 301 and that at the capacitor portion 307, the electrons generated by the photoelectric conversion portion 301 can be collected to the collection node 207 even if the transfer portion 303 is omitted. Also, by maintaining an appropriate relationship between the potential at the photoelectric conversion portion 302 and that at the capacitor portion 310, the holes generated by the photoelectric conversion portion 302 can be collected to the collection node 210 even if the transfer portion 306 is omitted. Furthermore, the photoelectric conversion portion 301 may be configured to also function as the capacitor portion 307 having a capacitance corresponding to the junction capacitance thereof, and the photoelectric conversion portion 302 may be configured to also function as the capacitor portion 310 having a capacitance corresponding to the junction capacitance thereof. For example, a high concentration region where the n-type impurity concentration is higher than in the other region may be provided in part of the n-type semiconductor region of the photodiode, and the high concentration region may be used as a collection node. As an alternative of switching between transfer and non-transfer of charge from the photoelectric conversion portions 301 and 302 by the transfer portions 303 and 306, switching between discharge and non-discharge of charge from the photoelectric conversion portions 301 and 302 from discharge portions connected to the photoelectric conversion portions 301 and 302 may be used. However, switching between transfer and non-transfer of charge using the transfer portions 303 and 306 enables accurate control of charge compared to the case of not using the transfer portions 303 and 306.

A reference potential supply portion 411 is connected to the anode 211 of the photoelectric conversion portion 301 and the reference node 217 of the capacitor portion 307. A reference potential VF1 is supplied in common from the reference potential supply portion 411 to the anode 211 of the photoelectric conversion portion 301 and the reference node 217 of the capacitor portion 307. A reference potential supply portion 412 is connected to the cathode 212 of the photoelectric conversion portion 302 and the reference node 200 of the capacitor portion 310. A reference potential VF2 is supplied in common from the reference potential supply portion 412 to the cathode 212 of the photoelectric conversion portion 302 and the reference node 200 of the capacitor portion 310.

As described above, the photoelectric conversion portion 301 also generates holes, but the holes are discharged to the anode 211 side. The photoelectric conversion portion 302 also generates electrons, but the electrons are discharged to the cathode 212 side.

The collection node 207 of the capacitor portion 307 and the collection node 210 of the capacitor portion 310 are connected in common to a detection node 220. A potential corresponding to the amount of electrons transferred from the photoelectric conversion portion 301 to the capacitor portion 307 and the capacitance of the capacitor portion 307 appears at the collection node 207 and the detection node 220. Also, a potential corresponding to the amount of holes transferred from the photoelectric conversion portion 302 to the capacitor portion 310 and the capacitance of the capacitor portion 310 appears at the collection node 210 and the detection node 220. As a result, a potential that is the combination of the potential that may appear at the detection node 220 due to the electrons collected by the collection node 207 and the potential that may appear at the detection node 220 due to the holes collected by the collection node 210 appears at the detection node 220.

The collection nodes 207 and 210 are electrically connected to each other. The electrical connection between the collection nodes 207 and 210 is established by a conductor (electrical conductor). Typically, the collection nodes 207 and 210 are directly connected to each other via a conductor. The conductor has a conductivity of $10^4$ S/m or more (a resistivity of $10^{-4}$ Ω·m or less). An insulator has a conductivity of $10^{-7}$ S/m or less (a resistivity of $10^{-7}$ Ω·m or more). A semiconductor has a conductivity between $10^{-7}$ S/m and $10^4$ S/m (a resistivity between $10^{-4}$ Ω·m and $10^7$ Ω·m). Examples of the conductor include metal, metal compound, graphite, and polysilicon. Silicon with a high impurity concentration ($10^{19}$/cm$^3$ or more) is also considered to have conductive behavior. Since the collection nodes 207 and 210 are connected to each other via a conductor, charge is smoothly transmitted and received between the collection nodes 207 and 210. This shortens the time until the potentials at the collection nodes 207 and 210 become static.

It is considered that the following phenomenon will occur transitionally. First, a difference occurs between the amount of electrons collected by the collection node 207 and the amount of holes collected by the collection node 210. In accordance with this difference, a potential difference occurs between the collection nodes 207 and 210. Electrons move between the collection nodes 207 and 210 via the conductor so as to reduce the potential difference. Then, the electrons and holes are recombined (pair annihilation) at the collection node 210. Accordingly, a potential corresponding to the amount of charge as a difference between the amount of electrons collected by the collection node 207 and the amount of holes collected by the collection node 210 appears at the detection node 220.

In this example, since the collection nodes 207 and 210 are directly connected to each other via the conductor, the potentials at the collection nodes 207 and 210 and the detection node 220 can be regarded as the same. Also, for example, a switch may be provided between the collection node 207 and the detection node 220 and/or between the collection node 210 and the detection node 220. Accordingly, driving can be temporarily performed so that at least two of the collection nodes 207 and 210 and the detection node 220 have different potentials.

The potential at the detection node 220 is represented by VN, the potential at the collection node 207 is represented by VN1, and the potential at the collection node 210 is represented by VN2. Here, the individual potentials VN, VN1, and VN2 are variable potentials. As described above, in the embodiment, the collection nodes 207 and 210 are connected in common to the detection node 220 and thus VN≈VN1≈VN2 is satisfied. In view of the ease of collecting the electrons of the cathode 201 of the photoelectric conversion portion 301 by the collection node 207, it may be better to satisfy VF1<VN1. Also, in view of the ease of collecting the holes of the anode 202 of the photoelectric conversion portion 302 by the collection node 210, it may be better to satisfy VN2<VF2. Regarding VF1<VN1 and VN2<VF2, VF1<VF2 is satisfied because VN1=VN2. Such a relationship in which the reference potential VF2 is higher than the reference potential VF1 (VF1<VF2) is more beneficial to increase the ranging accuracy than a relationship in which the reference potential VF2 is equal to or lower than the reference potential VF1 (VF1≥VF2). In this way, the efficiency of collecting charge increases, and also high-speed operation and highly accurate signal acquisition can be realized. From a practical point of view, in one embodiment, the potential difference between the reference potentials VF1 and VF2 may be 0.10 V or more. For this purpose, the reference potential supply portions 411 and 412 are separately provided in this example. The potential difference between the reference potentials VF1 and VF2 is typically 1 V or more and 5 V or less. The reference potential VF1 may be set to be lower than the ground potential GND of 0 V (VF1<GND) and the reference potential VF2 may be set to be higher than the ground potential GND of 0 V (GND<VF2). That is, the reference potential VF1 may be a negative potential and the reference potential VF2 may be a positive potential.

The detection node 220 is connected to a signal generation portion 315. In this example, the signal generation portion 315 is a MOS transistor (amplification transistor) including a gate, source, and drain. The detection node 220 is connected to the gate of the signal generation portion 315 (amplification transistor).

The drain of the signal generation portion 315 is connected to a power supply portion 432, and a power supply potential VDD is supplied thereto from the power supply portion 432. The source of the signal generation portion 315 is connected to a constant current source 430 via a MOS transistor (selection transistor) 316, and the signal generation portion 315 constitutes a source follower circuit together with the constant current source 430. At the time of a read operation, a selection signal SL is output from a selection signal supply portion 426 connected to the gate of the selection transistor 316 so that the selection transistor 316 is brought into an ON state. Accordingly, the signal generation portion 315 generates a pixel signal corresponding to the potential at the detection node 220 and outputs the pixel signal to an output line 431, which is included in the column wiring lines 130 illustrated in FIG. 1B.

In this example, an electric low-pass filter 433 is provided between the detection node 220 and the signal generation portion 315. With the electric low-pass filter 433 being provided, an output from the signal generation portion 315 can be stabilized and the ranging accuracy can be enhanced even if the potential at the detection node 220 fluctuates. The electric low-pass filter 433 may be formed of a resistor connected in series to the gate of the amplification transistor and a capacitor connected in parallel to the gate, but the configuration is not limited thereto. Alternatively, the electric low-pass filter 433 may be omitted.

A reset potential supply portion 413 is connected in common to the collection nodes 207 and 210 via a MOS transistor (reset transistor) 313. The reset potential supply portion 413 outputs a reset potential VS1. A reset signal RS1 output from a reset signal output portion 423 to the gate of the reset transistor 313 causes the reset transistor 313 to be in an ON state. Accordingly, a potential VS11 corresponding to the reset potential VS1 is supplied from the reset potential supply portion 413 to the collection node 207. That is, the potential VN1 at the collection node 207 becomes equal to the potential VS11 (VN1=VS11). Also, a potential VS12 corresponding to the reset potential VS1 is supplied from the reset potential supply portion 413 to the collection node 210. That is, the potential VN2 at the collection node 210 becomes equal to the potential VS12 (VN2=VS12).

At the time of a reset operation, the potential VS11 is supplied to the collection node 207 of the capacitor portion 307, and thereby the electrons held by the capacitor portion 307 are discharged to the reset potential supply portion 413. The potential VS12 is supplied to the collection node 210 of the capacitor portion 310, and thereby the holes held by the capacitor portion 310 are discharged to the reset potential supply portion 413.

To enhance the ranging accuracy, it is beneficial that the potential difference between the potential VS11 and the potential VS12 be less than 0.10 V, compared to a case where the potential difference therebetween is 0.10 V or more. When the potential difference between the potentials VS11 and VS12 is less than 0.10 V regarding the collection nodes 207 and 210 connected in common to the detection node 220, an operation in the accumulation period Tac after the reset period Trs can be stabilized. To make the potential difference between the potentials VS11 and VS12 less than 0.10 V, the collection nodes 207 and 210 may be connected to each other via a conductor having a high conductivity. Also, to make the potential difference between the potentials VS11 and VS12 less than 0.10 V, a resistor that causes the difference between the potentials VS11 and VS12 to be 0.10 V or more may not be located between the collection nodes 207 and 210. Note that a slight potential difference of less than 0.10 V that may be caused by an inevitably generated resistance or manufacturing error is allowable.

In this example, the potential VS11 is applied to the collection node 207 and at the same time the potential VS12 is applied to the collection node 210. A switch may be provided between the reset signal output portion 423 and the collection node 207 and between the reset signal output portion 423 and the collection node 210. In this case, the timing to apply the potential VS11 to the collection node 207 may be different from the timing to apply the potential VS12 to the collection node 210.

The potential VS11 may be higher than the reference potential VF1 (VF1<VS11). In this case, the efficiency of collecting electrons by the collection node 207 after the reset period Trs can be enhanced. Also, the potential VS12 may be lower than the reference potential VF2 (VS12<VF2). In this case, the efficiency of collecting holes by the collection node 210 after the reset period Trs can be enhanced. As described above, when VS11=VS12=VS1 is satisfied, the reset potential VS1 may be a potential between the reference potential VF1 and the reference potential VF2 (VF1<VS1<VF2) in order to satisfy both VF1<VS11 and VS12<VF2.

The potential VS11 can be selected from the range of −5 to +5 V. In one embodiment the potential VS11 is to be selected from the range of −2 to +2 V, for example. Also, the potential VS12 can be selected from the range of −5 to +5 V, and in one embodiment, the potential VS12 is to be selected from the range of −2 to +2 V, for example. The difference between the potential VS11 and the potential VS12 is to be 0. The circuit may be designed so as to satisfy VF1<VS11 and VS12<VF2 within the above-described ranges of the reference potentials VF1 and VF2 and within the above-described ranges of the potentials VS11 and VS12.

In the example illustrated in FIG. 3, a transfer portion 304 and a capacitor portion 308 are connected to the photoelectric conversion portion 301 in a manner similar to the transfer portion 303 and the capacitor portion 307. That is, a set of the transfer portion 303 and the capacitor portion 307 and a set of the transfer portion 304 and the capacitor portion 308 are connected in parallel to the photoelectric conversion portion 301. Likewise, a transfer portion 305 and a capacitor portion 309 are connected to the photoelectric conversion portion 302 in a manner similar to the transfer portion 306 and the capacitor portion 310. That is, a set of the transfer portion 306 and the capacitor portion 310 and a set of the transfer portion 305 and the capacitor portion 309 are connected in parallel to the photoelectric conversion portion 302. The transfer portion 304 and the capacitor portion 308 may have a configuration similar to the transfer portion 303 and the capacitor portion 307. The transfer potion 305 and the capacitor portion 309 may have a configuration similar to the transfer portion 306 and the capacitor portion 310.

In this example, the gate electrodes that have an MIS gate structure and that are respectively included in the transfer portions 304 and 305 are connected in common to a transfer node 219. The transfer node 219 is connected to a transfer signal output portion 429. A transfer signal TX2 is input from the transfer signal output portion 429 to the transfer node 219. The transfer portions 304 and 305 have different conductivity types and are provided complementarily. Thus, the transfer portion 305 is in an OFF state (non-conducting state) in a period when the transfer portion 304 is in an ON state (conducting state) in response to the transfer signal TX2, and the transfer portion 305 is in an ON state in a period when the transfer portion 304 is in an OFF state in response to the transfer signal TX2. A threshold may be set so that both the transfer portions 304 and 305 are brought into an OFF state when the transfer node 219 is at a predetermined potential. Such a predetermined potential is determined in accordance with the potential in the semiconductor region in the MIS gate structure and a threshold of the MIS gate structure. The difference between the potential level High that causes the transfer portion 304 to be in an ON state and the potential level Mid that causes the transfer portion 304 to be in an OFF state is, for example, 1 to 5 V. The difference between the potential level Low that causes the transfer portion 305 to be in an ON state and the potential level Mid that causes the transfer portion 305 to be in an OFF state is, for example, 1 to 5 V. The potential level High may be set to a potential (positive potential) higher than the ground potential GND (0 V), and the potential level Low may be set to a potential (negative potential) lower than the ground potential GND. For example, the potential level Mid can be set to the ground potential GND. Both the potential levels High and Low can be set to a positive potential, or both the potential levels High and Low can be set to a negative potential, so as to reduce the circuit scale. The transfer portions 304 and 305 may be connected to separate transfer nodes, and the ON/OFF state of the transfer portions 304 and 305 may be controlled by using transfer signals independent of each other. The transfer portions 303 and 304 connected to the photoelectric conversion portion 301 may be operated so that the ON and OFF states are reversed with respect to each other, that is, complementarily. Specifically, while the transfer portion 303 is in an ON state in response to the transfer signal TX1, the transfer portion 304 is in an OFF state in response to the transfer signal TX2. While the transfer portion 303 is in an OFF state in response to the transfer signal TX1, the transfer portion 304 is in an ON state in response to the transfer signal TX2. Also, the transfer portions 305 and 306 connected to the photoelectric conversion portion 302 may be operated so that the ON and OFF states are reversed with respect to each other, that is, complementarily. Specifically, while the transfer portion 306 is in an ON state in response to the transfer signal TX1, the transfer portion 305 is in an OFF state in response to the transfer signal TX2. While the transfer portion 306 is in an OFF state in response to the transfer signal TX1, the transfer portion 305 is in an ON state in response to the transfer signal TX2. Accordingly, signal charge from a single photoelectric conversion portion can be transferred alternately by two transfer portions connected to the single photoelectric conversion portion.

The capacitor portion 308 causes the electrons transferred from the photoelectric conversion portion 301 via the transfer portion 304 to be collected to a collection node 208. The capacitor portion 309 causes the holes transferred from the photoelectric conversion portion 302 via the transfer portion 305 to be collected to a collection node 209. The capacitor portions 308 and 309 each have a p-n junction diode structure. The collection node 208 of the capacitor portion 308 is an n-type semiconductor region, and the collection node 209 of the capacitor portion 309 is a p-type semiconductor region. A reference node 228 of the capacitor portion 308 is a p-type semiconductor region, and a reference node 229 of the capacitor portion 309 is an n-type semiconductor region. The reference node 228 is connected to the reference potential supply portion 411 and is supplied with the reference potential VF1. The reference node 229 is connected to the reference potential supply portion 412 and is supplied with the reference potential VF2.

The collection nodes 208 and 209 are connected in common to a reset potential supply portion 414 via a MOS transistor (reset transistor) 314. The reset potential supply portion 414 outputs a reset potential VS2. A reset signal RS2 output from a reset signal output portion 424 causes the reset transistor 314 to be in an ON state. Accordingly, the potentials at the collection nodes 208 and 209 can be set to predetermined reset potentials.

In the example illustrated in FIG. 3, the charge transferred from the photoelectric conversion portions to the collection nodes 208 and 209 in the capacitor portions 308 and 309 is discharged. However, similarly to the signal generation portion 315, a signal generation portion may be connected to the capacitor portions 308 and 309 and a signal based on the charge in the capacitor portions 308 and 309 may be read. In the case of using such a configuration, the signal generated by the signal generation portion on the basis of the charge in the capacitor portions 308 and 309 and the signal generated by the signal generation portion on the basis of the charge in the capacitor portions 307 and 310 can be combined. Accordingly, the intensity of the pixel signal can be enhanced.

Examples of potentials used in the above-described circuit will be described. The ground potential GND is 0 V. In a first example, VS1, VS2=0 V, VF1=−1 V, VF2=+1 V, High=+2 V, Mid=0 V, and Low=−2 V. In a second example, VS1, VS2=+1 V, VF1=0 V, VF2=+2 V, High=+3 V, Mid=+1 V, and Low=−1 V. The second example is obtained by shifting the individual potentials in the first example by S (V) and corresponds to the case where S=−1. In a third example, VS1, VS2=0 V, VF1=−2 V, VF2=+2 V, High=+4 V, Mid=0 V, and Low=−4 V. The third example is an example in which the potentials in the first example are multiplied by T and corresponds to the case where T=2. The above-described value S may be a positive or negative value, and the above-described value T may be less than 1. The second and third examples may be combined, that is, the first example may be shifted by S (V) and multiplied by T. The actual potential values can be appropriately adjusted while maintaining the relationship among values of potentials, the differences in potential, and the relationship among the differences in potential that are grasped from the individual potentials in the foregoing three examples.

Next, the operation per drive period Tdr of one photoelectric conversion cell 111 of the ranging apparatus 1 will be described with reference to FIGS. 4A to 4C. In the description given below with reference to FIGS. 4A to 4C, the periods p1 to p10 correspond to the period from time t0 to t10.

FIG. 4A illustrates a light emission level Le of the light emitting device 21 and light reception levels Lr1 and Lr2 of the photoelectric conversion device 11. The light emitting device 21 is in an OFF state in the periods p1, p4, p5, p7, and p9 when the light emission level Le corresponds to an amount of light Loff. The light emitting device 21 is in an ON state in the periods p2, p3, p6, and p8 when the light emission level Le corresponds to an amount of light Lon. In this way, the light emitting device 21 repeats blinking in one cycle that corresponds to a period Tcy from time t1 to time t5. Here, it is assumed that blinking is repeated three times for simplifying the description. Actually, however, blinking is repeated 100 to 10000 times within the accumulation period Tac every time ranging is performed, and thereby sufficient accuracy can be ensured.

When the speed of light is represented by c (m/s), a delay time from light emission to light reception based on a distance d (m) from the ranging apparatus 1 to the target 9 is 2×d/c (s). The delay time from light emission to light reception may be detected within one cycle Tcy. The speed of light is $3 \times 10^8$ m/s, that is, 0.3 m/ns. Thus, one cycle Tcy is set to, for example, 1 ns to 1000 ns, and in one embodiment, one cycle Tcy is set to 10 ns to 100 ns. For example, the delay from light emission to light reception corresponding to a distance difference of 0.3 m is 2 ns. Thus, if one cycle Tcy is 10 ns, a distance difference of 0.3 m can be detected by detecting a physical amount corresponding to the delay time within 10 ns. In accordance with the cycle Tcy and the number of times blinking is repeated, one ranging operation is carried out in a short time of 1 µs to 10 ms. Thus, about 10 to 1000 rows of the cell array 110, that is, about 1 to 1000 frames, can be read in one second. For example, if the drive period Tdr for one row is 1 µs, 1000 frames in 1000 rows can be read in one second. If the drive period Tdr for one row is 10 ms, 1 frame in 100 rows can be read in one second.

The amount of light received by the photoelectric conversion device 11 in response to light emission by the light emitting device 21 is represented by Lra and Lrb. The waveform represented by the light reception level Lr1 indicates that light reception is started at time t2, which is the time when a period Tda has elapsed since time t1 when light emission is started, and that light reception is finished at time t4, which is the time when a period Tda has elapsed since time t3 when light emission is finished, in accordance with the distance from the ranging apparatus 1 to the target. The waveform represented by the light reception level Lr2 indicates that light reception is started at time t2', which is the time when a period Tdb has elapsed since time t1 when light emission is started, and that light reception is finished at time t4', which is the time when a period Tdb has elapsed since time t3 when light emission is finished, in accordance with the distance from the ranging apparatus 1 to the target. In this example, Tda<Tdb and thus it can be understood that the target that has reflected the signal light represented by the light reception level Lr1 is closer to the ranging apparatus 1 than the target that has reflected the signal light represented by the light reception level Lr2. Furthermore, in this example, Lrb<Lra and thus it can be understood that the signal light represented by the light reception level Lr1 is likely to have a higher reflectance than the signal light represented by the light reception level Lr2.

In the period when the photoelectric conversion device 11 receives light emitted by the light emitting device 21, the amounts of light Lra and Lrb received by the photoelectric conversion device 11 include not only the signal light 82 but also the ambient light 83 illustrated in FIG. 1A. The amount of received ambient light is represented by Lam. Among the amounts of light Lra and Lrb, the amount of light obtained by subtracting Lam therefrom corresponds to signal light having actual distance information.

FIG. 4B illustrates a temporal change in the reset signals RS1 and RS2 (broken line), the selection signal SL (solid line), the transfer signal TX1 (one-dot chained line), and the transfer signal TX2 (two-dot chained line). The potential level High is higher than the potential level Low, and the potential level Mid is between the potential level High and the potential level Low. The potential level High, the potential level Mid, and the potential level Low may each include potentials in a certain range. For example, the potential level Mid is a potential in a certain range including the ground potential (0 V). In FIG. 4B, the potential at the position where the horizontal axis representing time is located corresponds to the potential level Mid. Regarding FIG. 4B, a description will be given under the assumption that, for convenience, transistors operate similarly to the case where the potential level is High, at a transitional potential between the potential level Mid and the potential level High (at a rising or falling potential). Also, a description will be given under the assumption that the transistors operate similarly to the case where the potential level is Low, at a transitional potential between the potential level Mid and the potential level Low (at a rising or falling potential). The potential levels that cause the individual transistors to be turned ON and OFF are not necessarily the same and may be different from one another.

The reset signals RS1 and RS2 are at the potential level High in the same period, but the periods when the reset signals RS1 and RS2 are at the potential level High may be different from each other. The transfer signals TX1 and TX2 are typically rectangular waves or sine waves with the same cycle in which positive and negative signs are inverted. The cycles of the transfer signals TX1 and TX2 are identical to the cycle Tcy in which the light emitting device 21 emits light. However, the cycles of the transfer signals may be slightly different from the light emission cycle if a decrease in the ranging accuracy is accepted.

In the period p1 when the reset signals RS1 and RS2 are at a potential higher than the potential level Mid (typically at the potential level High), the reset transistors 313 and 314 are in an ON state. From time t1 to time t10, which is a period when the reset signals RS1 and RS2 are at the potential level Mid, the reset transistors 313 and 314 are in an OFF state. In FIG. 4A, the illustration is given under the assumption that the reset signals RS1 and RS2 are the same. Alternatively, the reset signals RS1 and RS2 may be different from each other in a period that is not illustrated.

In the periods p2, p3, p6, and p8 when the transfer signal TX1 is at a potential higher than the potential level Mid (typically at the potential level High), the transfer portion 303 is in an ON state whereas the transfer portion 306 is in an OFF state. In the periods p4, p5, p7, and p9 when the transfer signal TX1 is at a potential lower than the potential level Mid (typically at the potential level Low), the transfer portion 303 is in an OFF state whereas the transfer portion 306 is in an ON state. The period from when the reset transistors 313 and 314 are changed from an ON state to an OFF state to when one of the transfer portions 303 and 306 is changed to an ON state may be as short as possible.

In the periods p2, p3, p6, and p8 when the transfer signal TX2 is at a potential lower than the potential level Mid (typically at the potential level Low), the transfer portion 305 is in an ON state whereas the transfer portion 304 is in an OFF state. In the periods p4, p5, p7, and p9 when the transfer signal TX2 is at a potential higher than the potential level Mid (typically at the potential level High), the transfer portion 305 is in an OFF state whereas the transfer portion 304 is in an ON state. The period from when the reset transistors 313 and 314 are changed from an ON state to an OFF state to when one of the transfer portions 304 and 305 is changed to an ON state may be as short as possible.

In the period (or at the time) when the transfer signal TX1 is at the potential level Mid, the transfer portions 303 and 306 are in an OFF state. In the period (or at the time) when the transfer signal TX2 is at the potential level Mid, the transfer portions 304 and 305 are in an OFF state. The potential level Mid is determined in accordance with the characteristics of the transfer portions 303, 304, 305, and 306, as described above.

FIG. 4C illustrates a change in the potential at the detection node 220. A potential change S1 represents the change in the potential according to the light reception level Lr1, and a potential change S2 represents the change in the potential according to the light reception level Lr2.

In the period p1, the potentials at the collection nodes 207 and 210 and the detection node 220 are set to potentials corresponding to the reset potential VS1 (the potentials VS11 and VS12) by the reset potential supply portion 413.

In the period p2, the electrons generated by the photoelectric conversion portion 301 in accordance with the amount of light Lam of the ambient light 83 are transferred to the capacitor portion 307. When electrons are generated by the photoelectric conversion portion 301, the potential at the cathode 201 becomes higher than the potential at the anode 211. If the potential at the anode 211 is, for example, VF1=−2 V, the potential at the cathode 201 is about −1 V. The reset potential VS1 makes the potential at the collection node 207 higher than the potential at the anode 211 (VF1<VS1). Thus, when the transfer portion 303 is in an ON state, electrons that have been generated quickly move to the collection node 207 at which the potential is higher than that at the cathode 201. In accordance with the transfer of the electrons, the potential at the detection node 220 connected to the collection node 207 decreases.

In the period p3, the electrons generated by the photoelectric conversion portion 301 in accordance with the amount of light Lra including the signal light 82, which is larger than the amount Lam of the ambient light 83, are transferred to the capacitor portion 307. In accordance with the transfer of the electrons, the potential at the detection node 220 connected to the collection node 207 decreases with a larger gradient than in the period p2. This is because the amount of received light per unit time increases by the amount of the signal light 82.

In the period p4, the holes generated by the photoelectric conversion portion 302 in accordance with the amount of light Lra including the signal light 82, which is larger than the amount Lam of the ambient light 83, are transferred to the capacitor portion 310. In accordance with the transfer of the holes, the potential at the detection node 220 connected to the collection node 210 increases.

In the periods p2 and p3, the transfer portion 305 is in an ON state. Thus, the holes generated by the photoelectric conversion portion 302 in the periods p2 and p3 are transferred to the capacitor portion 309 in the periods p2 and p3. Thus, among the holes transferred to the capacitor portion 310 after the transfer portion 306 is turned ON at time t3, for example, in the period p4, the amount of holes generated by the photoelectric conversion portion 302 in the period p4 is larger than the amount of holes generated by the photoelectric conversion portion 302 in the periods p2 and p3. Ideally, the holes generated by the photoelectric conversion portion 302 in the periods p2 and p3 are not transferred to the capacitor portion 310 in the period p4.

In the period p5, the holes generated by the photoelectric conversion portion 302 in accordance with the amount Lam of the ambient light 83 are transferred to the capacitor portion 310. In accordance with the transfer of the holes, the potential at the detection node 220 connected to the collection node 210 increases.

The same operation is repeated in the periods p6, p7, p8, and p9. In the periods p4 and p5, the transfer portion 304 is in an ON state. Thus, the electrons generated by the photoelectric conversion portion 301 in the periods p4 and p5 are transferred to the capacitor portion 308 in the periods p4 and p5. Thus, among the electrons transferred to the capacitor portion 307 after the transfer portion 303 is turned ON at time t5, for example, in the period p6, the amount of electrons generated by the photoelectric conversion portion 301 in the period p6 is larger than the amount of electrons generated by the photoelectric conversion portion 301 in the periods p4 and p5. Ideally, the electrons generated by the photoelectric conversion portion 301 in the periods p4 and p5 are not transferred to the capacitor portion 307 in the period p6.

With such a cycle Tcy being repeated several times, a signal suitable for ranging from which the component of the ambient light 83 has been removed and in which the component of the signal light 82 is integrated can be obtained.

Regarding the light reception level Lr1, the delay time Ida is less than a quarter of the cycle Tcy (Ida<Tcy/4). Thus, the potential at the detection node 220 is effectively dominated by the electrons transferred in the period p3, and the potential at the detection node 220 becomes lower than the reset potential VS1 (the absolute value increases). If the delay time Tdb is a quarter of the cycle Tcy as in the light reception level Lr2 (Tdb=Tcy/4), the amount of electrons and the amount of holes transferred to the collection nodes 207 and 210 within one cycle Tcy are equal to each other, and thus the potential at the detection node 220 is equal to the reset potential VS1. If the delay time Tda>Tcy/4, the potential at the detection node 220 is effectively dominated by the holes transferred in the period p4, and the potential at the detection node 220 becomes higher than the reset potential VS1 (the absolute value increase).

Here, the ON period and OFF period of the light emitting device 21 in one cycle Icy are equal to each other, but the ON period and OFF period may be different from each other. If the ON period and OFF period are different from each other, the signal output from the signal generation portion 315 may be corrected on the basis of the difference between the ON period and the OFF period. Furthermore, although the ON period and OFF period of the transfer gate in one cycle Icy are equal to each other here, the ON period and OFF period may be different from each other. If the ON period and OFF period are different from each other, the signal output from the signal generation portion 315 may be corrected on the basis of the difference between the ON period and the OFF period.

The potential that appears at the detection node 220 will be quantitatively described. Among the electrons serving as signal charge, a component derived from the ambient light 83 is represented by (−N), and a component derived from the signal light 82 is represented by (−S). Among the holes serving as signal charge, a component derived from the ambient light 83 is represented by (+N), and a component derived from the signal light 82 is represented by (+S). A coefficient proportional to the length of the period p2 is represented by a, a coefficient proportional to the length of the period p3 is represented by b, a coefficient proportional to the length of the period p4 is represented by c, and a coefficient proportional to the length of the period p5 is represented by d.

First, under the assumption that recombination of electrons and holes does not occur at the detection node 220, the amounts of charge at the collection nodes 207 and 210 are calculated. An increase in the amount of charge at the collection node 207 in the period p2 is expressed by a×(−N), and the amount of charge at the collection node 207 at time t2 is expressed by a×(−N). On the other hand, an increase in the amount of charge at the collection node 210 in the period p2 is 0, and the amount of charge at the collection node 210 at time t2 is 0. An increase in the amount of charge at the collection node 207 in the period p3 is expressed by b×(−N−S), and the amount of charge at the collection node 207 at time t3 is expressed by a×(−N)+b×(−N−S). On the other hand, an increase in the amount of charge at the collection node 210 in the period p3 is 0, and the amount of charge at the collection node 210 at time t3 is 0. An increase in the amount of charge at the collection node 207 in the period p4 is 0, and the amount of charge at the collection node 207 at time t4 is expressed by a×(−N)+b×(−N−S). An increase in the amount of charge at the collection node 210 in the period p4 is expressed by c×(+N+S), and the amount of charge at the collection node 210 at time t4 is expressed by c×(+N+S). An increase in the amount of charge at the collection node 207 in the period p5 is 0, and the amount of charge at the collection node 207 at time t5 is expressed by a×(−N)+b× (−N−S). On the other hand, an increase in the amount of charge at the collection node 210 in the period p5 is expressed by d×(+N), and the amount of charge at the collection node 210 at time t5 is expressed by c×(+N+S)+ d×(+N).

An actual amount of charge at the detection node 220 at time t5 corresponds to that obtained by subtracting electrons and holes, which is expressed by the following expression: a×(−N)+b×(−N−S)+c×(+N+S)+d×(+N)=(a+b)×(−N)+(c+ d)×(+N)+b×(−S)+c×(+S)=((c+d)−(a+b))×N+(c−b)×S. In the period from time t1 to time t5, if the ambient light 83 is constant and if the periods when the transfer portions 303 and 306 are complementarily in an ON state are the same, (c+d)−(a+b)=0 is satisfied. Thus, it is understood that the potential that appears at the detection node 220 at time t5 is obtained as a signal which is (c−b)×S from which at least part of the component of the ambient light 83 has been removed and which indicates only the component of the signal light 82.

FIGS. 5A to 5D illustrate an example layout of the photoelectric conversion cell 111. FIG. 5A is a schematic plan view of the photoelectric conversion cell 111. FIG. 5B is a schematic cross-sectional view taken along the line VB-VB in FIG. 5A, FIG. 5C is a schematic cross-sectional view taken along the line VC-VC in FIG. 5A, and FIG. 5D is a schematic cross-sectional view taken along the line VD-VD in FIG. 5A.

The semiconductor substrate 100 is provided with a p-type semiconductor region 511 serving as a p-type well and an n-type semiconductor region 512 serving as an n-type well. For example, the n-type semiconductor region 512 is an n-type epitaxial layer, whereas the p-type semiconductor region 511 is a p-type impurity diffusion region formed through ion implantation with a p-type impurity into the n-type epitaxial layer. A plurality of portions constituting a single semiconductor region, that is, each of the semiconductor regions 511 and 512, have the same conductivity type and are continuous to one another. Here, the plurality of portions are portions whose positions in at least any of X, Y, and Z directions are different. The plurality of portions constituting each of the semiconductor regions 511 and 512 may have different impurity concentrations. For example, the p-type semiconductor region 511 may have an impurity concentration that inclines in the depth direction (Z direction) of the semiconductor substrate 100.

In the photoelectric conversion cell 111, the photoelectric conversion portion 301 and the photoelectric conversion portion 302 are arranged along a front surface 1000 of the semiconductor substrate 100. The direction in which the photoelectric conversion portions 301 and 302 are arranged is the X direction, the direction parallel to the front surface 1000 and vertical to the X direction is the Y direction, and the direction vertical to the front surface 1000 is the Z direction.

As a structure different from that illustrated in FIGS. 5A to 5D, the photoelectric conversion portions 301 and 302 may be arranged in the Z direction. That is, one of the photoelectric conversion portions 301 and 302 may be located at a position in the semiconductor substrate 100 deeper than the other. For example, the cathode (n-type semiconductor region) of the photoelectric conversion portion 301 and the anode (p-type semiconductor region) of the photoelectric conversion portion 302 are located in the Z direction from the front surface 1000. Also, the anode (p-type semiconductor region) of the photoelectric conversion portion 301 and the cathode (n-type semiconductor region) of the photoelectric conversion portion 302 are located therebetween so as to achieve p-n junction isolation. With a p-type semiconductor region serving as a charge movement path that is connected to the anode of the photoelectric conversion portion 302 being extended toward the front surface 1000, signal charge of the photoelectric conversion portion 302 located at a deep position can be collected through the charge movement path. In this case, however, the amount of light subjected to photoelectric conversion by the photoelectric conversion portion at a shallower position is different from the amount of light subjected to photoelectric conversion by the photoelectric conversion portion at a deeper position, and accordingly a great difference occurs in the amount of signal charge to be generated. This is because the light is absorbed in the semiconductor substrate 100 and is attenuated. Thus, for the purpose of decreasing the difference in the amount of received light between the photoelectric conversion portions 301 and 302, the photoelectric conversion portions 301 and 302 may be arranged along the front surface 1000 of the semiconductor substrate 100.

In FIGS. 5A to 5D, bold lines represent local wiring lines provided in the photoelectric conversion cell 111. Circles represent the positions of contact portions that are used to establish a connection between the semiconductor substrate 100 and the local wiring lines or global wiring lines (not illustrated) such as the row wiring lines 120 and the column wiring lines 130 described above with reference to FIG. 1B. At a typical contact portion, a contact plug and the semiconductor substrate 100 are connected to each other. Here, a local wiring line is a wiring line for electrically connecting elements in the photoelectric conversion cell 111 to each other. On the other hand, a global wiring line is a wiring line for connecting the photoelectric conversion cells 111 to each other or connecting the photoelectric conversion cells 111 to a circuit outside the cell array 110. The row wiring lines 120 and the column wiring lines 130 described above with reference to FIG. 1B are typical global wiring lines. A wiring line is a member composed of a conductor for establishing an electrical connection. At a contact portion for establishing a connection with a semiconductor region, part of the semiconductor region connected to a conductor such as a contact plug is an impurity region of high concentration compared to the other part, and thereby favorable electrical connection may be ensured.

As illustrated in FIG. 5B, in the Y direction, an n-type semiconductor region 507, a transfer gate electrode 503, an n-type semiconductor region 501, a transfer gate electrode 504, and an n-type semiconductor region 508 are arranged in this order along the line VB-VB.

As illustrated in FIG. 5C, in the Y direction, a p-type semiconductor region 510, a transfer gate electrode 505, a p-type semiconductor region 502, a transfer gate electrode 506, and a p-type semiconductor region 509 are arranged in this order along the line VC-VC.

As illustrated in FIG. 5A, in the X direction, a gate electrode 513 of the reset transistor 313, a gate electrode 514 of the reset transistor 314, a gate electrode 515 of the amplification transistor, and a gate electrode 516 of the selection transistor 316 are arranged in this order. The gate electrode 515 of the amplification transistor constituting the signal generation portion 315 serves as an input node of the signal generation portion 315 and is connected to the detection node 220 directly or via the electric low-pass filter 433.

The n-type semiconductor region 507 is part of the capacitor portion 307 and constitutes the collection node 207. In other words, the n-type semiconductor region 507 is a first floating diffusion. The semiconductor region 511 forms a p-n junction in conjunction with the semiconductor region 507, and the semiconductor region 511 constitutes the reference node 217 of the capacitor portion 307.

The p-type semiconductor region 510 is part of the capacitor portion 310 and constitutes the collection node 210. In other words, the p-type semiconductor region 510 is a second floating diffusion. The semiconductor region 512 forms a p-n junction in conjunction with the semiconductor region 510, and the semiconductor region 512 constitutes the reference node 200 of the capacitor portion 310.

The n-type semiconductor region 501 is part of the photoelectric conversion portion 301 and constitutes the cathode 201 of the photodiode. The semiconductor region 501 forms a p-n junction in conjunction with the semiconductor region 511, and the semiconductor region 511 constitutes the anode 211 of the photodiode. The impurity concentration of the n-type semiconductor region 501 may be low enough to be depleted at a built-in potential. Accordingly, in the electron-hole pairs generated by the photoelectric conversion portion 301, the electrons generated as signal charge are less likely to be accumulated in the photoelectric conversion portion 301. As a result, the transfer efficiency of electrons from the photoelectric conversion portion 301 to the semiconductor region 507 increases. Also, electrons generated from light can be completely transferred to the semiconductor region 507, and noise caused by low transfer efficiency can be reduced. The holes not used as signal charge in the photoelectric conversion portion 301 are discharged through the p-type semiconductor region 511. A front surface region, which is a p-type semiconductor region, is provided between the n-type semiconductor region 501 and the front surface 1000 of the semiconductor substrate 100, and the n-type semiconductor region 501 is located apart from the front surface 1000. Accordingly, the photoelectric conversion portion 301 serves as a buried photodiode. In FIGS. 5A to 5D, the p-type semiconductor region serving as a front surface region is integrated with the p-type semiconductor region 511.

The p-type semiconductor region 502 is part of the photoelectric conversion portion 302 and constitutes the anode 202 of the photodiode. The semiconductor region 502 forms a p-n junction in conjunction with the semiconductor region 512, and the semiconductor region 512 constitutes the cathode 212 of the photodiode. The impurity concentration of the p-type semiconductor region 502 may be low enough to be depleted at a built-in potential. Accordingly, in the electron-hole pairs generated by the photoelectric conversion portion 302, the holes generated as signal charge are less likely to be accumulated in the photoelectric conversion portion 302. As a result, the transfer efficiency of holes from the photoelectric conversion portion 302 to the semiconductor region 510 increases. Also, holes generated from light can be completely transferred to the semiconductor region 510, and noise caused by low transfer efficiency can be reduced. The electrons not used as signal charge in the photoelectric conversion portion 302 are discharged through the p-type semiconductor region 511. A front surface region, which is an n-type semiconductor region, is provided between the p-type semiconductor region 502 and the front surface 1000 of the semiconductor substrate 100, and the p-type semiconductor region 502 is located apart from the front surface 1000. Accordingly, the photoelectric conversion portion 302 serves as a buried photodiode. In FIGS. 5A to 5D, the n-type semiconductor region serving as a front surface region is integrated with the n-type semiconductor region 512.

The n-type semiconductor region 508 forms a p-n junction in conjunction with the semiconductor region 511. The semiconductor region 508 is part of the capacitor portion 308 and constitutes the collection node 208. The p-type semiconductor region 509 forms a p-n junction in conjunction with the semiconductor region 512. The semiconductor region 509 is part of the capacitor portion 309 and constitutes the collection node 209. The n-type semiconductor region 501 and the p-type semiconductor region 502 are arranged in the X direction along the front surface 1000. The n-type semiconductor region 501 and the p-type semiconductor region 502 are isolated from each other, but may be in contact with each other. In this example, the p-type semiconductor region 511 and the n-type semiconductor region 512 form a p-n junction between the n-type semiconductor region 501 and the p-type semiconductor region 502. Accordingly, the semiconductor region 501 and the semiconductor region 502 are electrically isolated from each other (p-n junction isolation).

The reference potential VF1 is supplied to the semiconductor region 511 from a contact plug 611 that constitutes the reference potential supply portion 411. Also, the reference potential VF2 is supplied to the semiconductor region 512 from a contact plug 612 that constitutes the reference potential supply potion 412. The reference potential VF1 is lower than the reference potential VF2, and thereby a reverse bias voltage is applied between the semiconductor regions 511 and 512. Thus, a depletion layer generated between the semiconductor regions 511 and 512 causes the semiconductor regions 511 and 512 to be electrically isolated from each other. Accordingly, the electrons generated by the n-type semiconductor region 501 and the holes generated by the p-type semiconductor region 502 can be electrically isolated from each other. Thus, charge can be collected by a corresponding collection node at appropriate timing and signal charges for ranging can be selectively recombined. Also, the photoelectric conversion portions 301 and 302 are isolated from each other by p-n junction isolation and thereby the interval between the photoelectric conversion portions 301 and 302 can be decreased (for example, less than 1 μm). Accordingly, the difference in the amount of received light between the photoelectric conversion portions 301 and 302 can be decreased. Furthermore, the p-n junction isolation is able to suppress the occurrence of dark current compared to insulator isolation.

In the cell array 110, the photoelectric conversion cells 111 each having the structure illustrated in FIG. 5A are arranged in a matrix. The n-type semiconductor region 512 is provided among the plurality of photoelectric conversion cells 111, serving as a continuous common well. On the other hand, the p-type semiconductor region 511 is provided among the plurality of photoelectric conversion cells 111, serving as a discontinuous isolated well. That is, the p-type semiconductor region 511 of a certain photoelectric conversion cell 111 may be electrically isolated from the p-type semiconductor region 511 of at least one of the adjoining photoelectric conversion cells 111 by isolation such as p-n junction isolation. Contrary to the above-described example, the n-type semiconductor region 512 may serve as an isolated well and the p-type semiconductor region 511 may serve as a common well. In this way, with use of one of the n-type semiconductor region 512 and the p-type semiconductor region 511 as a common well, the configuration of the photoelectric conversion cell 111 can be simplified.

In plain view, the transfer gate electrode 503 that includes at least a portion located between the n-type semiconductor region 501 and the n-type semiconductor region 507 constitutes the transfer portion 303. In this example, the transfer gate electrode 503 is located above part of the semiconductor region 501 and part of the semiconductor region 507. In plain view, the transfer gate electrode 504 that includes at least a portion located between the n-type semiconductor region 501 and the n-type semiconductor region 508 constitutes the transfer portion 304. In this example, the transfer gate electrode 504 is located above part of the semiconductor region 501 and part of the semiconductor region 508.

In plain view, the transfer gate electrode 505 that includes at least a portion located between the p-type semiconductor region 502 and the p-type semiconductor region 510 constitutes the transfer portion 306. In this example, the transfer gate electrode 505 is located above part of the semiconductor region 502 and part of the semiconductor region 510. In plain view, the transfer gate electrode 506 that includes at least a portion located between the p-type semiconductor region 502 and the p-type semiconductor region 509 constitutes the transfer portion 305. In this example, the transfer gate electrode 506 is located above part of the semiconductor region 502 and part of the semiconductor region 509.

An insulating film 500 is provided between the semiconductor substrate 100 and the transfer gate electrodes 503, 504, 505, and 506. The insulating film 500 functions as a gate insulating film.

A local wiring line 618 is connected in common to the transfer gate electrodes 503 and 505 via contact plugs 603 and 605 so that the same transfer signal TX1 is supplied to the transfer gate electrodes 503 and 505. Here, the transfer gate electrodes 503 and 505 are provided as separate gate electrodes. A gate electrode performs charge/discharge every time it is driven and thus a current corresponding to MOS capacitance flows every time switching is performed. In the case of performing high-speed driving, the MOS capacitance decreases as the size of the gate electrode of the transistor decreases, and accordingly a small current flows and power is saved. Thus, with the transfer gate electrodes 503 and 505 being provided separately, the size of the gate electrodes can be decreased as much as possible.

Alternatively, an integrated gate electrode including a portion serving as the transfer portion 303 and a portion serving as the transfer portion 305 may be provided. With this configuration, the number of wiring lines can be decreased and the wiring capacitance and resistance can be decreased, and accordingly the accuracy of complementary control of the transfer portions 303 and 305 can be enhanced. Furthermore, a decreased number of wiring lines enables a higher aperture ratio and higher sensitivity. The same applies to the transfer gate electrodes 504 and 506.

A reset transistor including the gate electrode 513 is connected to the semiconductor regions 507 and 510 via contact plugs 607 and 610, a local wiring line 620, and a contact plug 613. In this example, the local wiring line 620 constitutes the detection node 220. The gate electrode 513 is connected to the reset signal output portion 423 outside the cell array via a contact plug, a local wiring line, and a global wiring line. The contact plug 613 is connected to a semiconductor region 523, which corresponds to one of source/drain regions of the reset transistor. The other source/drain regions of the reset transistor are connected to the reset potential supply portion 413 outside the cell array via a global wiring line. Also, a reset transistor including the gate electrode 514 is connected to the semiconductor regions 508 and 509 via a local wiring line and a contact plug.

The amplification transistor including the gate electrode 515 is connected to the semiconductor regions 507 and 510 via the local wiring line 620 and a contact plug 615. The contact plug 615 is connected to the gate electrode 515 of the amplification transistor. The drain of the amplification transistor is connected to the power supply portion 432 via a contact plug and a global wiring line. The source of the amplification transistor is connected to the drain of the selection transistor 316 including the gate electrode 516. The source of the selection transistor 316 is connected to a global wiring line (the column wiring lines 130) via a contact plug.

The contact plug 611 is connected to the semiconductor region 511. The contact plug 611 is connected to the reference potential supply portion 411 outside the cell array 110 via a global wiring line. The contact plug 612 is connected to the semiconductor region 512. The contact plug 612 is connected to the reference potential supply portion 412 outside the cell array 110 via a global wiring line. In this way, a reference potential is supplied to the semiconductor regions 511 and 512 via wiring lines, and thereby variations in the reference potential in the individual photoelectric conversion cells 111 in the cell array 110 can be decreased. Alternatively, a reference potential may be supplied without locating the contact plugs 611 and 612 in the photoelectric conversion cells 111. In this case, an impurity diffusion layer extending from the inside of the cell array 110 to the outside thereof may be provided on the semiconductor substrate 100, and a reference potential may be supplied to the impurity diffusion layer outside the cell array 110 via a wiring line and a contact plug. However, as described above, when the p-type semiconductor region 511 is an isolated well, it is difficult to extend the p-type semiconductor region 511 to the outside of the cell array 110. Thus, regarding at least an isolated well, a reference potential may be supplied thereto via a conductor provided on the semiconductor substrate 100, such as a global wiring line, a local wiring line, and a contact plug. The same applies to the case where the n-type semiconductor region 512 is an isolated well.

The semiconductor regions 507 and 510 are connected to each other via a conductor. In this example, the conductor that connects the semiconductor regions 507 and 510 includes the local wiring line 620 and the contact plugs 607 and 610. The conductor that connects the semiconductor regions 507 and 510 is made of a material with a higher conductivity than the semiconductor substrate 100, such as a metallic material, a metal compound material, or polysilicon. A metallic material and a metal compound material are used for wiring lines and contact plugs, and polysilicon is used for gate electrodes. The metal compound material may be a semiconductor-metal compound material such as silicide. These materials are used alone or in combination to connect the semiconductor regions 507 and 510. In this way, the semiconductor regions 507 and 510 are connected to each other via a conductor and thus the semiconductor regions 507 and 510 can be connected to each other without using a p-n junction. Typically, the semiconductor regions 507 and 510 can be connected to each other via an ohmic contact. With the semiconductor regions 507 and 510 being connected to each other via a conductor, a configuration in which the semiconductor regions 507 and 510 do not form a p-n junction is obtained. Thus, in the case of recombining electrons and holes, the time for alleviating a potential difference between the semiconductor regions 507 and 510 can be shortened. As a result, the output of the detection node 220 can be stabilized and highly accurate ranging can be realized.

FIGS. 6A to 6D illustrate example structures for obtaining the electrical connection between the semiconductor regions 507 and 510. FIGS. 6A to 6D correspond to a cross-section including the transfer gate electrodes 503 and 505 and the semiconductor regions 507 and 510 illustrated in FIG. 5A. FIG. 6A illustrates a structure for obtaining the electrical connection between the semiconductor regions 507 and 510 in FIGS. 5A to 5D. FIGS. 6B to 6D illustrate forms different from the form in FIG. 6A for obtaining the electrical connection between the semiconductor regions 507 and 510. In FIGS. 6A to 6D, the transfer gate electrodes 503 and 505 are electrically connected to each other via the local wiring line 618. The local wiring line 618 is in contact with the contact plug 603 on the transfer gate electrode 503 and the contact plug 605 on the transfer gate electrode 505. The contact plugs 603 and 605 extend through an interlayer insulating film 526, and the local wiring line 618 is located on the interlayer insulating film 526. The local wiring line 618 may be, for example, an aluminum wiring line including a conductive portion mainly containing aluminum and a barrier metal portion including a titanium layer and/or titanium nitride layer. Alternatively, the local wiring line 618 may be a copper wiring line including a conductive portion mainly containing copper and a barrier metal portion including a tantalum layer and/or tantalum nitride layer. The copper wiring line has a single damascene structure or dual damascene structure. The other local wiring lines are also aluminum wiring lines or copper wiring lines.

In the form illustrated in FIG. 6A, the semiconductor regions 507 and 510 are connected to each other via the contact plugs 607 and 610 and the local wiring line 620 that connects the contact plugs 607 and 610. The contact plug 607 is connected to the semiconductor region 507 via the interlayer insulating film 526, and the contact plug 610 is connected to the semiconductor region 510 via the interlayer insulating film 526. The contact plugs 607 and 610 each include a conductive portion mainly containing tungsten and a barrier metal portion that is located between the conductive portion and the interlayer insulating film 526 and that includes a titanium layer and/or titanium nitride layer. The local wiring line 620 is an aluminum wiring line including a conductive portion mainly containing aluminum and a barrier metal portion that is located between the conductive portion and the interlayer insulating film 526 and that includes a titanium layer and/or titanium nitride layer. Alternatively, the local wiring line 620 is a copper wiring line including a conductive portion mainly containing copper and a barrier metal portion that is located between the conductive portion and the interlayer insulating film 526 and that includes a tantalum layer and/or tantalum nitride layer.

In the form illustrated in FIG. 6B, the semiconductor regions 507 and 510 are connected to each other via a contact plug 623, which is a conductor that is in contact with both the semiconductor regions 507 and 510. The contact plug 623 includes a conductive portion mainly containing tungsten and a barrier metal portion that is located between the conductive portion and the interlayer insulating film 526 and that includes a titanium layer and/or a titanium nitride layer. An insulating film 527, which is separated from the insulating film 500 and the interlayer insulating film 526, is provided between the contact plug 623 and the semiconductor substrate 100. The insulating film 527 insulates the contact plug 623 and the p-type semiconductor region 511 from each other and insulates the contact plug 623 and the n-type semiconductor region 512 from each other. Accordingly, an electrical connection between the p-type semiconductor region 511 and the n-type semiconductor region 512 can be suppressed.

In the form illustrated in FIG. 6C, the semiconductor regions 507 and 510 are connected to each other via a local wiring line 624, which is a conductor that is in contact with both the semiconductor regions 507 and 510. The local wiring line 624 can be formed by patterning a tungsten film or silicide film. The local wiring line 624 is located between the interlayer insulating film 526 and the semiconductor substrate 100. The local wiring line 624 may be formed after the transfer gate electrodes 503 and 505 have been formed, and then the interlayer insulating film 526 and the contact plugs 603 and 605 may be formed. An insulating film 528, which is separated from the insulating film 500 and the interlayer insulating film 526, is provided between the local wiring line 624 and the semiconductor substrate 100. The insulating film 528 insulates the local wiring line 624 and the p-type semiconductor region 511 from each other and insulates the local wiring line 624 and the n-type semiconductor region 512 from each other. Accordingly, an electrical connection between the p-type semiconductor region 511 and the n-type semiconductor region 512 can be suppressed.

In the form illustrated in FIG. 6D, the semiconductor regions 507 and 510 are connected to each other via a local wiring line 625, which is a conductor that is in contact with both the semiconductor regions 507 and 510. The local wiring line 625 can be formed by patterning a polysilicon film and can be formed at the same time as the transfer gate electrodes 503 and 505. The local wiring line 625 is located between the interlayer insulating film 526 and the semiconductor substrate 100. The insulating film 500 is located between the local wiring line 625 and the semiconductor substrate 100 so as to achieve insulation between the local wiring line 625 and the p-type semiconductor region 511 and insulation between the local wiring line 625 and the n-type semiconductor region 512.

The above-described local wiring lines and global wiring lines can be constituted by connecting a plurality of wiring layers stacked in the direction vertical to the front surface 1000 of the semiconductor substrate 100 to one another by using via plugs.

Next, with reference to FIG. 7, a description will be given of a modification example of the equivalent circuit of the photoelectric conversion cell 111 described above with reference to FIG. 3.

The collection node 207 of the capacitor portion 307 is connected to the detection node 220 via a switch transistor 318. When a switch signal SW1 output from a switch signal output portion 438 causes the switch transistor 318 to be in an ON state, a potential corresponding to the potential at the collection node 207 appears at the detection node 220. The collection node 210 of the capacitor potion 310 is connected to the detection node 220 via a switch transistor 319. When a switch signal SW2 output from a switch signal output portion 439 causes the switch transistor 319 to be in an ON state, a potential corresponding to the potential at the collection node 210 appears at the detection node 220. In this way, ON/OFF of the electrical connection with the collection nodes 207 and 210 can be switched in this modification example. In other words, the collection nodes 207 and 210 are electrically connected to each other via the switch transistors 318 and 319. Alternatively, one of the switch transistors 318 and 319 may be omitted.

The reset potential supply portion 413 is connected to the collection node 207 of the capacitor portion 307 via the reset transistor 313. The reset signal RS1 output from the reset signal output portion 423 causes the reset transistor 313 to be in an ON state. Accordingly, the reset potential VS1 is supplied from the reset potential supply portion 413 to the collection node 207 of the capacitor portion 307. A reset potential supply portion 417 is connected to the collection node 210 of the capacitor portion 310 via a reset transistor 317. A reset signal RS3 output from a reset signal output portion 427 causes the reset transistor 317 to be in an ON state. Accordingly, a reset potential VS3 is supplied from the reset potential supply portion 417 to the collection node 210 of the capacitor portion 310.

In one embodiment, the potential difference between the reset potential VS1 and the reset potential VS3 is to be less than 0.10 V and the potential difference between the reset potential VS1 and the reset potential VS3 is to be 0 V. However, a slight potential difference of less than 0.10 V due to inevitable resistance or manufacturing error is allowed. The reset potential VS1 and the reset potential VS3 may be a potential between the reference potential VF1 and the reference potential VF2. For example, the reset potential VS1 may be higher than the reference potential VF1 (VF1<VS1). Also, the reset potential VS3 may be lower than the reference potential VF2 (VS3<VF2). The reset potential VS1 is, for example, −1 to +1 V. In one embodiment, the reset potential VS1 is −0.5 to +0.5 V. The reset potential VS3 is, for example, −1 to +1 V, and in one embodiment, is −0.5 to +0.5 V.

With the reset potential VS1 being supplied to the capacitor portion 307, the electrons held by the capacitor portion 307 are discharged to the reset potential supply portion 413. With the reset potential VS3 being supplied to the capacitor portion 310, the holes held by the capacitor portion 310 are discharged to the reset potential supply portion 417. According to this modification example, one of a signal based on the charge (electrons) obtained through photoelectric conversion performed by the photoelectric conversion portion 301 and a signal based on the charge (holes) obtained through photoelectric conversion performed by the photoelectric conversion portion 302 can be selectively read from the detection node 220. With such an operation mode, the photoelectric conversion device 11 capable of executing both image capturing and ranging can be obtained.

In this modification example, the capacitor portions 308 and 309 may be omitted so as to quickly discharge unnecessary charge by turning ON/OFF the transfer portions 304 and 305. With this configuration, an aperture ratio and the area of the photoelectric conversion portions can be increased by reducing the number of wiring lines, and the sensitivity can be increased.

Figure 7:
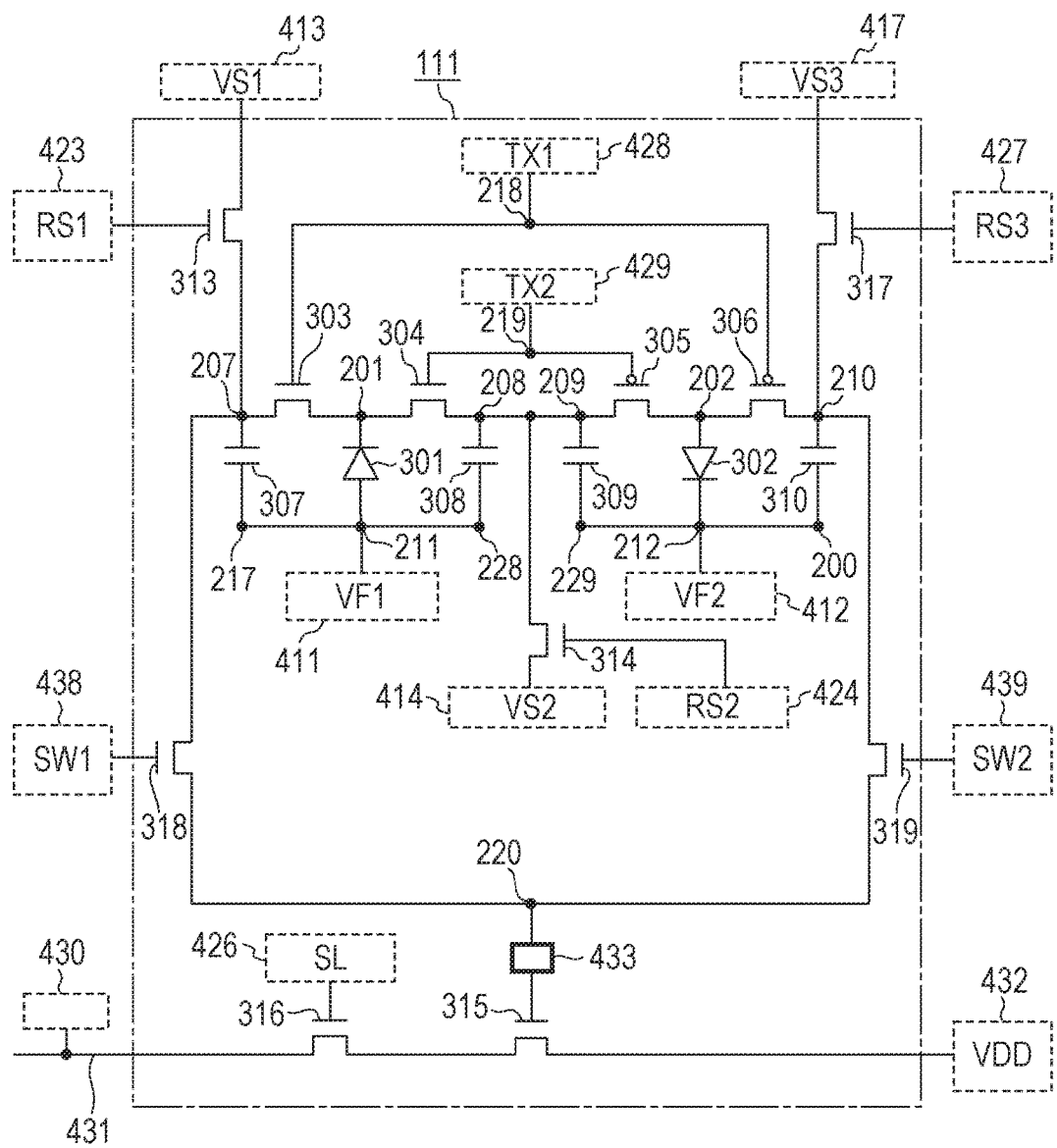
FIG. 7 is a schematic diagram for describing a circuit of the photoelectric conversion device.
Figure 8:
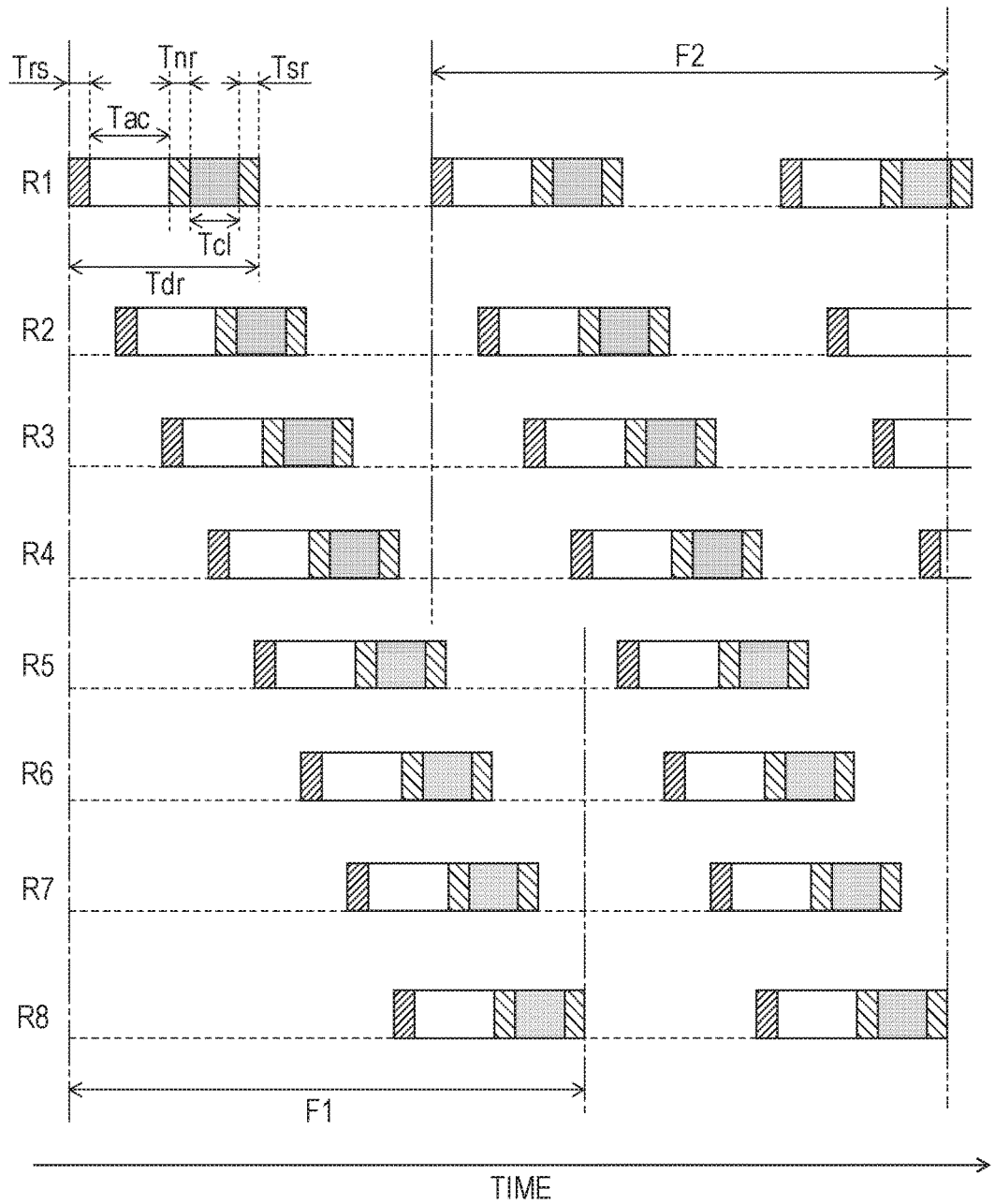
FIG. 8 is a schematic diagram for describing an operation of the photoelectric conversion device.

FIG. 8 illustrates an example of the operation of the circuit illustrated in FIG. 7. There are a read period Tnr in which the ambient light 83 is read and a removal period Tcl in which the component of the ambient light 83 is removed between the accumulation period Tac and the read period Tsr illustrated in FIG. 2. In the accumulation period Tac after the reset period Trs, the switch transistor 318 is in an ON state and the switch transistor 319 is in an OFF state. In the read period Tnr, the selection transistor 316 is in an ON state while the switch transistor 318 remains in an ON state and the switch transistor 319 remains in an OFF state. Accordingly, a signal at the detection node 220 at which a potential corresponding to the potential at the collection node 207 appears is read. After the read period Tnr, there is the removal period Tcl in which at least part of the component of the ambient light 83 is removed. In the removal period Tcl, the selection transistor 316 is in an OFF state, and the switch transistors 318 and 319 illustrated in FIG. 7 are in an ON state. Accordingly, recombination between the electrons and holes cancels out the component of the ambient light 83. Then the potential from which the component of the ambient light 83 has been removed appears at the detection node 220. In the read period Tsr, the selection transistor 316 is brought into an ON state to read a signal from which the component of the ambient light 83 has been removed. As a result of reading the ambient light 83 in this manner, not only an image including distance information but also an image based on the ambient light 83 can be obtained.

Application examples of the information processing system SYS will be described with reference to FIG. 1A.

A first application example of the information processing system SYS is an example of applying it to a camera equipped with an image capturing apparatus. The information processing apparatus 2 operates the ranging apparatus 1 upon receipt of a signal indicating an instruction to perform ranging from the control apparatus 3 including an input unit such as a focus control unit (for example, a focus button). Subsequently, the ranging apparatus 1 outputs a signal including distance information representing the distance to the target 9, which is a subject, to the information processing apparatus 2. The information processing apparatus 2 processes the signal and generates a drive signal for driving mechanical components such a lens, diaphragm, and shutter so as to set conditions suitable for capturing an image of the target 9. The information processing apparatus 2 then outputs the drive signal to the driving apparatus 4 such as a motor that drives the lens, diaphragm, and shutter. The driving apparatus 4 drives these mechanical components in response to the drive signal. Upon receipt of a signal indicating an instruction to capture an image from the control apparatus 3, the information processing apparatus 2 instructs the image capturing apparatus 5 to capture an image, and accordingly the image capturing apparatus 5 captures an image of the target 9. The information processing apparatus 2 displays the image obtained from the image capturing apparatus 5 on the display apparatus 6. The information processing apparatus 2 is capable of displaying the obtained image on the display apparatus 6 together with distance information. The communication apparatus 7 communicates with a storage apparatus or a network and stores the image in the storage apparatus or a storage over the network.

A second application example of the information processing system SYS is an example of applying it to a video information processing system that provides a user with mixed reality. When the information processing apparatus 2 operates the ranging apparatus 1 and the image capturing apparatus 5, the image capturing apparatus 5 captures an image of the target 9 as a subject and outputs it as a real image. On the other hand, the ranging apparatus 1 outputs a signal including distance information representing the distance to the target 9 as a subject. The information processing apparatus 2 processes the signal and generates a composite image by combining a virtual image formed by using computer graphics or the like and the real image obtained through capturing by the image capturing apparatus 5 on the basis of the distance information. The information processing apparatus 2 displays the composite image on the display apparatus 6 such as a head mounted display.

A third application example of the information processing system SYS is an example of applying it to transportation equipment that moves under power (for example, a car or train). Upon receipt of a signal indicating an instruction to move the transportation equipment or to get ready to move it from the control apparatus 3 that includes a device for generating a signal to start an engine (for example, a start button) and an input unit such as a handle and accelerator, the information processing apparatus 2 operates the ranging apparatus 1. The ranging apparatus 1 outputs a signal including distance information representing the distance to the target 9 as a subject. The information processing apparatus 2 processes the signal, and displays a warning on the display apparatus 6 if, for example, the distance to the target 9 becomes short. The information processing apparatus 2 is capable of displaying information representing the distance to the target 9 on the display apparatus 6. Also, the information processing apparatus 2 is capable of reducing or increasing the speed of the transportation equipment by driving the driving apparatus 4 such as a brake or engine on the basis of the distance information. Furthermore, the information processing apparatus 2 is capable of adjusting the relative distance to transportation equipment that is running ahead by driving the driving apparatus 4 such as a brake or engine on the basis of the distance information.

A fourth application example of the information processing system SYS is an example of applying it to a game system. A user instructs a main body of a game machine to use a gesture mode by using the control apparatus 3 including an input unit such as a controller. In response to the instruction from the user, the information processing apparatus 2 operates the ranging apparatus 1. Accordingly, the ranging apparatus 1 detects a movement (gesture) of the user as distance information. On the basis of the obtained distance information, the information processing apparatus 2 creates video in which a virtual character in the game is operated in accordance with the movement of the user. The information processing apparatus 2 displays the video on the display apparatus 6 connected to the main body of the game machine (information processing apparatus 2).

As described above, the photoelectric conversion device 11 according to the embodiment includes a first photodiode (photoelectric conversion portion 301) that generates electrons and a second photodiode (photoelectric conversion portion 302) that generates holes. Furthermore, the photoelectric conversion device 11 includes the n-type first semiconductor region 507 that collects the electrons generated by the first photodiode (photoelectric conversion portion 301) and the p-type second semiconductor region 510 that collects the holes generated by the second photodiode (photoelectric conversion portion 302). Furthermore, the photoelectric conversion device 11 includes the signal generation portion 315 to which the first semiconductor region 507 and the second semiconductor region 510 are connected in common. Furthermore, the photoelectric conversion device 11 includes the reference potential supply portion 411 that supplies the reference potential VF1 to the anode 211 of the first photodiode (photoelectric conversion portion 301) and the reference potential supply portion 412 that supplies the reference potential VF2 to the cathode 212 of the second photodiode (photoelectric conversion portion 302). The reference potential VF2 is higher than the reference potential VF1. Such a photoelectric conversion device is capable of accurately obtaining a signal that is based on electrons and holes.

As described above, the photoelectric conversion device 11 according to the embodiment includes the photoelectric conversion portion 301 that generates electrons and the photoelectric conversion portion 302 that generates holes. Also, the photoelectric conversion device 11 includes the n-type semiconductor region 507 that collects the electrons generated by the photoelectric conversion portion 301 and the p-type semiconductor region 510 that collects the holes generated by the photoelectric conversion portion 302. Furthermore, the photoelectric conversion device 11 includes the signal generation portion 315 to which the semiconductor region 507 and the semiconductor region 510 are connected in common. The difference between the first potential VS11 supplied to the semiconductor region 507 and the second potential VS12 supplied to the semiconductor region 510 in the reset period Trs is less than 0.10 V. Such a photoelectric conversion device is capable of accurately obtaining a signal corresponding to the difference in signal charge between a plurality of photoelectric conversion portions. Also, the photoelectric conversion device is capable of obtaining, with a simple configuration, a signal corresponding to the difference in signal charge between a plurality of photoelectric conversion portions.

As described above, the photoelectric conversion device 11 according to the embodiment includes the photoelectric conversion portion 301 that generates electrons and the photoelectric conversion portion 302 that generates holes. Also, the photoelectric conversion device 11 includes the n-type semiconductor region 507 that collects the electrons generated by the photoelectric conversion portion 301 and the p-type semiconductor region 510 that collects the holes generated by the photoelectric conversion portion 302. Furthermore, the photoelectric conversion device 11 includes the signal generation portion 315 to which the semiconductor region 507 and the semiconductor region 510 are connected in common. The semiconductor region 507 and the semiconductor region 510 are connected to each other via the local wiring line 620, which is a conductor. Such a photoelectric conversion device is capable of obtaining, with a simple configuration, a signal corresponding to the difference in signal charge between a plurality of photoelectric conversion portions. Also, the photoelectric conversion device is capable of accurately obtaining a signal corresponding to the difference in signal charge between a plurality of photoelectric conversion portions.

As described above, the photoelectric conversion device 11 according to the embodiment includes the photoelectric conversion portion 301 that generates electrons and the photoelectric conversion portion 302 that generates holes. Also, the photoelectric conversion device 11 includes the transfer portion 303 that transfers the electrons generated by the photoelectric conversion portion 301 to the n-type semiconductor region 507 and the transfer portion 306 that transfers the holes generated by the photoelectric conversion portion 302 to the p-type semiconductor region 510. Furthermore, the photoelectric conversion device 11 includes the signal generation portion 315 to which the semiconductor region 507 and the semiconductor region 510 are connected in common. The transfer portion 303 and the transfer portion 306 are connected to the same transfer node 218. With the potential level High being supplied to the transfer node 218, the transfer portion 303 is brought into an ON state and the transfer portion 306 is brought into an OFF state. With the potential level Low being supplied to the transfer node 218, the transfer portion 303 is brought into an OFF state and the transfer portion 306 is brought into an ON state. Such a photoelectric conversion device is capable of accurately obtaining a signal that is based on electrons and holes. Furthermore, the signal that is based on electrons and holes can be obtained by using a simple configuration.

As described above, the photoelectric conversion device 11 according to the embodiment includes a first photodiode (photoelectric conversion portion 301) that generates electrons and a second photodiode (photoelectric conversion portion 302) that generates holes. Furthermore, the photoelectric conversion device 11 includes the n-type first semiconductor region 507 that collects the electrons generated by the first photodiode (photoelectric conversion portion 301) and the p-type second semiconductor region 510 that collects the holes generated by the second photodiode (photoelectric conversion portion 302). Furthermore, the photoelectric conversion device 11 includes the signal generation portion 315 to which the first semiconductor region 507 and the second semiconductor region 510 are connected in common. The p-type semiconductor region 511 that constitutes the anode 211 of the first photodiode (photoelectric conversion portion 301) and the n-type semiconductor region 512 that constitutes the cathode 212 of the second photodiode (photoelectric conversion portion 302) are electrically isolated from each other by a p-n junction. Such a photoelectric conversion device is capable of obtaining, with a simple configuration, a signal corresponding to the difference in signal charge between a plurality of photoelectric conversion portions. Also, the photoelectric conversion device is capable of accurately obtaining a signal corresponding to the difference in signal charge between a plurality of photoelectric conversion portions.

The photoelectric conversion device is not limited to the above-described examples and is applicable to various information processing systems SYS. In the above embodiment, a description has been given of examples of a photoelectric conversion device optimized to perform driving for ranging, and a ranging apparatus and image capturing system including the device. The photoelectric conversion device may perform driving for something other than ranging. For example, edge detection for detecting a contour of an object such as a human face, focal point detection using phase difference detection, or ranging may be performed by using a signal corresponding to the difference in signal charge between a plurality of photoelectric conversion portions. Such operations can be performed because the difference in the amount of received light between a plurality of photoelectric conversion portions can be detected on the basis of the magnitude of a signal output from the signal generation portion in accordance with the difference in signal charge. In general, a complicated structure such as a differential circuit may be necessary to obtain a difference in electric signals by converting signal charge into electric signals by using a signal generation portion such as a source follower circuit. However, the photoelectric conversion device according to the embodiment is capable of easily obtaining a difference in signal charge between a plurality of photoelectric conversion portions by using recombination between electrons and holes. Furthermore, by converting the difference in signal charge into an electric signal by using a signal generation portion having a simple structure, for example, a source follower circuit, the photoelectric conversion device is capable of obtaining a signal corresponding to the difference in signal charge between the plurality of photoelectric conversion portions. With a switch transistor being provided between a collection node and a detection node as in the form illustrated in FIG. 7, a signal corresponding to original signal charge, not a signal corresponding to the difference between the plurality of photoelectric conversion portions, can be read separately from the signal corresponding to the difference. Accordingly, an image capturing operation can be performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2015-157636, No. 2015-157637, No. 2015-157638, NO. 2015-157639, and No. 2015-157640, filed Aug. 7, 2015, which are hereby incorporated by reference herein in their entirety.

What is claimed is:

1. A photoelectric conversion device comprising:
a first photoelectric conversion portion configured to generate electrons, the first photoelectric conversion portion being a first photodiode;
a second photoelectric conversion portion configured to generate holes, the second photoelectric conversion portion being a second photodiode;
a charge-to-voltage conversion portion including an n-type first semiconductor region configured to collect the electrons and a p-type second semiconductor region configured to collect the holes, the charge-to-voltage conversion portion being configured to convert a charge that is based on the electrons and the holes to a voltage; and
a signal generation portion configured to generate a signal corresponding to the voltage, the signal generation portion including an amplification transistor, wherein
the first photoelectric conversion portion includes a p-type third semiconductor region that constitutes an anode of the first photodiode,
the second photoelectric conversion portion includes an n-type fourth semiconductor region that constitutes a cathode of the second photodiode, and
the third semiconductor region and the fourth semiconductor region are electrically isolated from each other.

2. The photoelectric conversion device according to claim 1, wherein the first semiconductor region and the second semiconductor region are configured so that a difference between a potential of the first semiconductor region and a potential of the second semiconductor region is less than 0.10 V.

3. The photoelectric conversion device according to claim 1, further comprising a reset potential supply portion connected to the first semiconductor region via a reset transistor, the reset potential supply portion being configured to supply a potential to the first semiconductor region.

4. The photoelectric conversion device according to claim 3, wherein the reset potential supply portion is connected to the second semiconductor region via the reset transistor.

5. The photoelectric conversion device according to claim 1, wherein the first semiconductor region and the second semiconductor region are connected to each other via a conductor.

6. The photoelectric conversion device according to claim 1, wherein the first semiconductor region and the second semiconductor region are connected to each other via a conductor, the photoelectric conversion device further comprising a reset potential supply portion configured to supply a reset potential to the conductor.

7. The photoelectric conversion device according to claim 1, further comprising:
a first potential supply portion configured to supply a first potential to an anode of the first photodiode; and
a second potential supply portion configured to supply a second potential to a cathode of the second photodiode, wherein the second potential is higher than the first potential.

8. The photoelectric conversion device according to claim 7, wherein the first potential is lower than a ground potential and the second potential is higher than the ground potential.

9. A photoelectric conversion device comprising:
a first photoelectric conversion portion configured to generate electrons, the first photoelectric conversion portion being a first photodiode;
a second photoelectric conversion portion configured to generate holes, the second photoelectric conversion portion being a second photodiode;
a charge-to-voltage conversion portion including an n-type first semiconductor region configured to collect the electrons and a p-type second semiconductor region configured to collect the holes, the charge-to-voltage conversion portion being configured to convert a charge that is based on the electrons and the holes to a voltage; and
a signal generation portion configured to generate a signal corresponding to the voltage, the signal generation portion including an amplification transistor, wherein
the first photoelectric conversion portion includes a p-type third semiconductor region that constitutes an anode of the first photodiode,
the second photoelectric conversion portion includes an n-type fourth semiconductor region that constitutes a cathode of the second photodiode, and
the third semiconductor region and the fourth semiconductor region form a p-n junction.

10. The photoelectric conversion device according to claim 9, wherein the p-n junction formed by the third semiconductor region and the fourth semiconductor region is present between an n-type fifth semiconductor region that constitutes a cathode of the first photodiode and a p-type sixth semiconductor region that constitutes an anode of the second photodiode.

11. The photoelectric conversion device according to claim 1, further comprising:
a first transfer potion configured to transfer the generated electrons to the first semiconductor region; and
a second transfer potion configured to transfer the generated holes to the second semiconductor region.

12. A photoelectric conversion device comprising:
a first photoelectric conversion portion configured to generate electrons;
a second photoelectric conversion portion configured to generate holes;
a charge-to-voltage conversion portion including an n-type first semiconductor region configured to collect the electrons and a p-type second semiconductor region configured to collect the holes, the charge-to-voltage conversion portion being configured to convert a charge that is based on the electrons and the holes to a voltage;
a first transfer potion configured to transfer the generated electrons to the first semiconductor region;
a second transfer potion configured to transfer the generated holes to the second semiconductor region;
a signal generation portion configured to generate a signal corresponding to the voltage, the signal generation portion including an amplification transistor, wherein
the first transfer potion and the second transfer portion are connected to a common node, and
the first transfer portion is turned on and the second transfer portion is turned off by supplying a first potential to the node, and the first transfer portion is turned off and the second transfer portion is turned on by supplying a second potential to the node.

13. A photoelectric conversion device comprising:
a first photoelectric conversion portion configured to generate electrons;
a second photoelectric conversion portion configured to generate holes;
a charge-to-voltage conversion portion including an n-type first semiconductor region configured to collect the electrons and a p-type second semiconductor region configured to collect the holes, the charge-to-voltage conversion portion being configured to convert a charge that is based on the electrons and the holes to a voltage;
a first transfer potion configured to transfer the generated electrons to the first semiconductor region;
a second transfer potion configured to transfer the generated holes to the second semiconductor region;
a signal generation portion configured to generate a signal corresponding to the voltage, the signal generation portion including an amplification transistor;
an n-type seventh semiconductor region different from the first semiconductor region;
a third transfer portion configured to transfer the generated electrons to the seventh semiconductor region;
a p-type eighth semiconductor region different from the second semiconductor region; and
a fourth transfer portion configured to transfer the generated holes to the eighth semiconductor region.

14. The photoelectric conversion device according to claim 1, wherein the amplification transistor constitutes a source follower circuit, and the charge-to-voltage conversion portion is electrically connected to a gate electrode of the amplification transistor.

15. The photoelectric conversion device according to claim 1, wherein at least one of the first semiconductor region and the second semiconductor region is electrically connected to the signal generation portion via at least one of an electric low-pass filter and a transistor.

16. The photoelectric conversion device according to claim 1, wherein the charge-to-voltage conversion portion converts a charge that is based on a difference between the electrons collected by the first semiconductor region and the holes collected by the second semiconductor region to a voltage.

17. The photoelectric conversion device according to claim 1, wherein the first photoelectric conversion portion and the second photoelectric conversion portion are arranged on a semiconductor substrate in a direction along a front surface of the semiconductor substrate.

18. The photoelectric conversion device according to claim 1, further comprising cells that are arranged in a matrix,
wherein each of the cells includes photoelectric conversion portions, and wherein one of the cells includes the first photoelectric conversion portion, the second photoelectric conversion portion, the charge-to-voltage conversion portion, and the signal generation portion.

19. A ranging apparatus comprising:
a light emitting device; and
the photoelectric conversion device according to claim 1, wherein the photoelectric conversion device receives light emitted by the light emitting device.

20. The ranging apparatus according to claim 19, wherein the light emitting device repeats blinking, and collection of the electrons to the first semiconductor region and collection of the holes to the second semiconductor region are alternately performed.

21. An information processing system comprising:
- a ranging apparatus including the photoelectric conversion device according to claim 1; and
- an information processing apparatus configured to process information obtained from the ranging apparatus.

22. The information processing system according to claim 21, wherein the information processing apparatus performs at least one of a process for displaying information processed by the information processing apparatus on a display apparatus and a process for driving a driving apparatus on the basis of information processed by the information processing apparatus.

23. The photoelectric conversion device according to claim 13, further comprising a signal generating portion connected to a capacitor portion including the seventh semiconductor region and the eighth semiconductor region,
- wherein a signal generated by the signal generating portion and the signal generated by the signal generation portion are combined.

24. The photoelectric conversion device according to claim 13, wherein
- the first photoelectric conversion portion is a first photodiode, and
- the second photoelectric conversion portion is a second photodiode.

* * * * *